US012476627B2

(12) United States Patent
Zhu et al.

(10) Patent No.: US 12,476,627 B2
(45) Date of Patent: Nov. 18, 2025

(54) HIGH FREQUENCY DIFFERENTIAL SINGLE POLE MULTIPLE THROW SWITCH MODULE

(71) Applicant: Menlo Microsystems, Inc., Irvine, CA (US)

(72) Inventors: Xu Zhu, Belmont, MA (US); Seung Yang, Corona, CA (US); Jonathan Leitner, Rancho Mission Viejo, CA (US); Chris Giovanniello, Aliso Viejo, CA (US)

(73) Assignee: Menlo Microsystems, Inc., Irvine, CA (US)

( * ) Notice: Subject to any disclaimer, the term of this patent is extended or adjusted under 35 U.S.C. 154(b) by 121 days.

(21) Appl. No.: 18/366,880

(22) Filed: Aug. 8, 2023

(65) Prior Publication Data

US 2024/0056068 A1    Feb. 15, 2024

Related U.S. Application Data

(60) Provisional application No. 63/481,703, filed on Jan. 26, 2023, provisional application No. 63/371,064, filed on Aug. 10, 2022.

(51) Int. Cl.
*H03K 7/00*    (2006.01)
*H03K 17/00*    (2006.01)

(52) U.S. Cl.
CPC ................. *H03K 17/002* (2013.01)

(58) Field of Classification Search
CPC ........ H03K 17/002; H03K 17/00; H01P 1/10; H01P 1/122; H01P 1/127; H01P 5/12;

(Continued)

(56) References Cited

U.S. PATENT DOCUMENTS 6,143,997 A    11/2000  Feng et al.
6,940,363 B2 *  9/2005  Zipper ................. H01H 1/0036
                                                                333/262

(Continued)

FOREIGN PATENT DOCUMENTS

CN        100373516 C    3/2008
WO     2024/036138 A1    2/2024

OTHER PUBLICATIONS

International Search Report and Written Opinion received for PCT Patent Application No. PCT/US23/71828, mailed on Nov. 28, 2023, 10 pages.

(Continued)

*Primary Examiner* — Hai L Nguyen
(74) *Attorney, Agent, or Firm* — Hamilton, Brook, Smith & Reynolds, P.C.

(57) ABSTRACT

A device for switching a differential signal includes an input port, a first output port, a second output port, a first micro electromechanical system (MEMS) switch, and a second MEMS switch. The first and second MEMS switches selectively couple the input port to either the first output port or the second output port. The differential input port is separated into two single-ended paths. One single-ended path is switched through the first MEMS switch, and the other single-ended path is switched through the second MEMS switch. The single-ended paths are spatially matched with respect to length and orientation, and are at least partially distributed through at least two layers of electrical conductors, with adjacent layers of electrical conductors separated by electrically insulating layers.

20 Claims, 23 Drawing Sheets

(58) Field of Classification Search
CPC ...... H01P 5/16; H01P 5/00; H01P 3/00; H01P 3/08; H01P 3/081
USPC ................. 327/373, 415; 333/101, 103, 108
See application file for complete search history.

(56) References Cited

U.S. PATENT DOCUMENTS

| | | |
|---|---|---|
| 6,992,629 B2 | 1/2006 | Kerner et al. |
| 7,084,724 B2 | 8/2006 | Cetiner et al. |
| 7,315,223 B2 | 1/2008 | Margomenos |
| 7,499,257 B2 | 3/2009 | Lempkowski et al. |
| 7,824,997 B2 | 11/2010 | Margomenos et al. |
| 8,592,876 B2 | 11/2013 | Ding et al. |
| 9,048,053 B2 | 6/2015 | Morihara et al. |
| 10,573,479 B2 | 2/2020 | Stefanini et al. |
| 11,148,935 B2 | 10/2021 | Zhu et al. |
| 2008/0100394 A1 | 5/2008 | Margomenos et al. |
| 2008/0278259 A1 | 11/2008 | Ni |
| 2013/0168783 A1 | 7/2013 | Ding et al. |
| 2014/0009244 A1 | 1/2014 | Pavageau |
| 2014/0184352 A1 | 7/2014 | Morihara et al. |
| 2014/0253260 A1 | 9/2014 | Horimoto et al. |
| 2015/0353348 A1 | 12/2015 | Vandemeer et al. |
| 2017/0187086 A1 | 6/2017 | Koul et al. |
| 2017/0278646 A1 | 9/2017 | Morita |
| 2020/0102213 A1 | 4/2020 | Haridas et al. |
| 2020/0270120 A1 | 8/2020 | Zhu et al. |
| 2021/0242557 A1 | 8/2021 | Evtyushkin et al. |
| 2022/0221670 A1 | 7/2022 | Patra et al. |
| 2025/0243052 A1 | 7/2025 | Zhu |
| 2025/0246790 A1 | 7/2025 | Hong et al. |

OTHER PUBLICATIONS

International Search Report and Written Opinion received for PCT Patent Application No. PCT/US2025/013335, mailed on Apr. 16, 2025, 19 pages.
International Search Report and Written Opinion received for PCT/US2025/013552, mailed on May 12, 2025, 14 pages.
Eisenstadt, W. R., et al., "Microwave Differential Circuit Design USING Mixed-Mode S-Parameters", CD Rom Included, 2006, 247 pages.
Pozer, D. M., "Microwave Engineering", Fourth Edition, 2012, John Wiley & Sons, Inc., 756 pages.

* cited by examiner

HIGH FREQUENCY DIFFERENTIAL SINGLE POLE MULTIPLE THROW SWITCH MODULE

RELATED APPLICATIONS

This application claims the benefit of U.S. Provisional Application No. 63/371,064, filed on Aug. 10, 2022, and claims the benefit of U.S. Provisional Application 63/481,703 filed on Jan. 26, 2023. The entire teachings of the above applications are incorporated herein by reference.

BACKGROUND

A signal source may need to be switched between two destinations. Complications may arise if the signal source generates a differential signal, especially for a high frequency/data rate differential signal. If, for example, the switching and signal path layout architecture is not the same for each side of the differential signal, high frequency signal performance may be degraded due to issues such as path length and impedance differences.

For example, increased network speeds are driving faster memory and serial bus communications between chipsets. Precision high-speed testing of chipsets on design-in-boards is forcing test engineers to utilize higher precision components on loopback paths with switches to route the signals back into the DUT. These loopback paths may include protocols such as PCIe 4.0/5.0, SerDes, Ethernet, USB3.x/4, and HDMI.

One of the limiting factors with increasing data rates, such as for PCIe 5.0 specifications, is the switch performance at higher frequencies. The lifespan of an EM relay switch is up to 10 million cycles, with switching speed in the range of milli-seconds.

U.S. Patent Application Publication No. 2014/0253260 (Horimoto) describes a prior art technique for switching a differential signal. Referring to FIG. 13 of Horimoto, signal lines 150a and 150b constitute a signal line pair for conveying a differential signal to switches (see Horimoto at paragraph [0014]). As shown, signal line 150a is oriented differently as compared to signal line 150b. More specifically, line 150b of Horimoto is shown to bend back on itself, which may result in self-coupling along its length that does not occur in signal line 150a. This self-coupling in signal line 150b may result in impedance/reflection characteristics that are not matched by signal line 150a, the effect of which will be accentuated as the signal frequency/data rate increases.

SUMMARY

The embodiments described herein are directed to a device for switching a differential signal. The device may comprise an input port, a first output port, a second output port, a first micro electromechanical system (MEMS) switch, and a second MEMS switch. The first and second MEMS switches may selectively couple the input port to either the first output port or the second output port. The differential input port may be separated into two single-ended paths. One single-ended path may be switched by the first MEMS switch, and the other single-ended path may be switched by the second MEMS switch. The single-ended paths may be spatially matched to one another with respect to length and orientation, and are at least partially distributed through at least two layers of electrical conductors, with adjacent layers of electrical conductors separated by electrically insulating layers. The electrical characteristics (e.g., impedance matching, reflection coefficients, et al.) of the two single-ended paths from the input port to either of the output ports is substantially the same.

In one aspect, the invention may be a device for switching a differential signal that comprises an input port comprising a first conductor and a second conductor, a first output port comprising a third conductor and a fourth conductor, and a second output port comprising a fifth conductor and a sixth conductor. The device may further comprise a first micro electromechanical system (MEMS) switch having an input, a first output and a second output, the first MEMS switch input being electrically coupled to the first conductor through a first signal path. The first MEMS switch first output may be electrically coupled to the third conductor through a second signal path, and the first MEMS switch second output may be electrically coupled to the fifth conductor through a third signal path. The device may further comprise a second MEMS switch having an input, a first output, and a second output. The second MEMS switch input may be electrically coupled to the second conductor through a fourth signal path, the second MEMS switch first output may be electrically coupled to the fourth conductor through a fifth signal path, and the second MEMS switch second output may be electrically coupled to the sixth conductor through a sixth signal path. The first signal path and the second signal path may be spatially matched with respect to length and orientation. The third, fourth, fifth and sixth signal paths may be spatially matched with respect to length and orientation.

The third, fourth, fifth, and sixth signal paths may be distributed through at least two layers of electrical conductors. Each adjacent pair of layers of electrical conductors may be separated by an electrically insulating layer. The first signal path and the second signal path may be disposed between adjacent layers of electrically conductive material that are fixed at a common voltage potential. At least a portion of each of the first signal path and the second signal path may be disposed as coplanar waveguides. The device may further comprise two or more conductive vias arranged on either side of each of the first signal path and the second signal path. Each of the two or more conductive vias may be electrically coupled to the adjacent layers of electrically conductive material. Other embodiments may incorporate a stripline waveguide configuration or a microstrip waveguide configuration to implement the portions of the first and second signal paths described above.

The first MEMS switch and the second MEMS switch may each have a pole corresponding to a first contact and at least two throws associated with at least a second contact and a third contact. The second contact and the third contact may be symmetrically distributed about the first contact.

In another aspect, the invention may be a device for switching a differential signal within an operating frequency range that comprises a first signal path from a first signal component of a differential input port to a first micro electromechanical system (MEMS) switch input of a first MEMS switch, and from a first MEMS switch output of the first MEMS switch to a first signal component of a differential output port. The device may further comprise a second signal path from a second signal component of a differential input port to a second MEMS switch input of a second MEMS switch, and from a second MEMS switch output of the second MEMS switch to a second signal component of a differential output port. Each of the first signal path and the second signal path may be distributed through at least two layers of electrical conductors, with adjacent layers of electrical conductors separated by electrically insulating layers. An electrical length of the first signal path may be substantially the same as an electrical length of the second signal path, and a spatial orientation of the first signal path may be matched to a spatial orientation of the second signal path such that an impedance of the first signal path at a frequency within the operating frequency range is substantially the same as an impedance of the second signal path at the frequency within the operating frequency range.

The first signal path and the second signal path may be disposed between layers of electrically conductive material that are fixed at a common voltage potential. At least a portion of each of the first signal path and the second signal path may be disposed as coplanar waveguides. The device may further comprise two or more conductive vias arranged on either side of each of the first signal path and the second signal path, wherein each of the two more conductive vias are electrically coupled to the layers of electrically conductive material. The spatial orientation of the first signal path may be symmetrical to the spatial orientation of the second signal path. The first MEMS switch and the second MEMS switch may each have a pole corresponding to a first contact and at least two throws associated with at least a second contact and a third contact. The second contact and the third contact may be symmetrically distributed about the first contact.

In another aspect, the invention may be a device for switching a differential signal that comprises a first micro electromechanical system (MEMS) switch mounted on a multi-layer assembly and a second MEMS switch mounted on the multi-layer assembly. The first MEMS switch may have a first MEMS switch input that is selectively electrically coupled to one of a first MEMS switch first output and a first MEMS switch second output. The second MEMS switch may have a second MEMS switch input that is selectively electrically coupled to one of a second MEMS switch first output and a second MEMS switch second output. The multi-layer assembly may have a top surface, a bottom surface, a first edge, a second edge, a third edge, and a fourth edge. The first and second edges may be opposite one another and the third and fourth edges may be opposite one another. The multi-layer assembly may comprise at least two layers of electrically conductive material. Each adjacent pair of layers of electrically conductive material may be separated by an electrically insulating layer. The multi-layer assembly may further comprise an input port disposed at the first edge, a first output port disposed on the second edge, and a second output port disposed on the second edge. The input port may have a first input conductor and a second input conductor, the first output port may have a first output conductor and a second output conductor, and the second output port may have a third output conductor and a fourth output conductor. The first input conductor may be electrically coupled to the first MEMS switch input through a first input signal path on one of the at least two layers of electrically conductive material. The first MEMS switch first output may be electrically coupled to the first output conductor by a first output signal path that passes through two or more of the at least two layers of electrically conductive material. The first MEMS switch second output may be electrically coupled to the third output conductor by a second output signal path that passes through two or more of the at least two layers of electrically conductive material. The second input conductor may be electrically coupled to the second MEMS switch input through a second input signal path on the one of the at least two layers of electrically conductive material. The second MEMS switch first output may be electrically coupled to the second output conductor by a third output signal path that passes through two or more of the at least two layers of electrically conductive material. The second MEMS switch second output may be electrically coupled to the fourth output conductor by a fourth output signal path that passes through two or more of the at least two layers of electrically conductive material. The first input signal path and the second input signal path may be configured such that impedance characteristics of the first input signal path and impedance characteristics of the second input signal path are substantially the same.

Each of the first signal path and the second signal path may be disposed between two layers of electrically conductive material that are fixed at a common voltage potential. One of the two layers may be immediately above the signal path, and another of the two layers may be immediately below the signal path. At least a portion of each of the first path and the second path may be disposed as a coplanar waveguide. The device may further comprise two or more conductive vias arranged on either side of each of the first signal path and the second signal path. Each of the two more conductive vias is electrically coupled to the layers of electrically conductive material. The spatial orientation of the first signal path may be symmetrical to the spatial orientation of the second signal path.

The first MEMS switch and the second MEMS switch may each have a pole corresponding to a first contact and at least two throws associated with at least a second contact and a third contact. The second contact and the third contact may be symmetrically distributed about the first contact.

The first output signal path and the third output signal path may be configured such that impedance characteristics of the first output signal path and impedance characteristics of the third output signal path are substantially the same. The second output signal path and the fourth output signal path may be configured such that impedance characteristics of the second output signal path and impedance characteristics of the fourth output signal path are substantially the same. In general, some or all of the output signal paths may be configured to have the same or substantially the same impedance characteristics.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

Figure 1A:
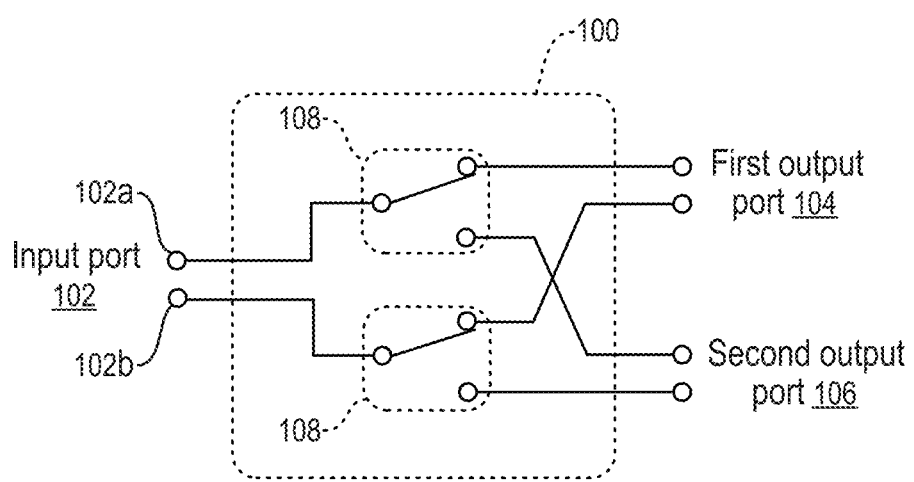
FIG. 1A shows an example of a differential switch device according to an example embodiment of the invention.

FIG. 1A illustrates an example of a differential switch device 100 according to an embodiment of the invention. The differential switch device 100 receives a differential signal at differential input port 102, and operates to switch the differential signal from the differential input port 102 to either first differential output port 104 or second differential output port 106. The switching is performed by a pair of single pole, double throw (SPDT) switches 108 and 110, each of which receives the same activation signal. The differential signal at input port 102 consists of two complementary single-ended signals. The first 102a of the two complementary signals is routed through the first SPDT switch 108 to either the first output port 104 or the second output port 106, and the second 102b of the two complementary signals is routed through the second SPDT switch 110 to either the first output port 104 or the second output port 106. The activation signals to the first switch 108 and the second switch 110 are coordinated so that the complementary signals 102a, 102b are both routed to either the first output port 104 or the second output port 106.

Figure 1B:
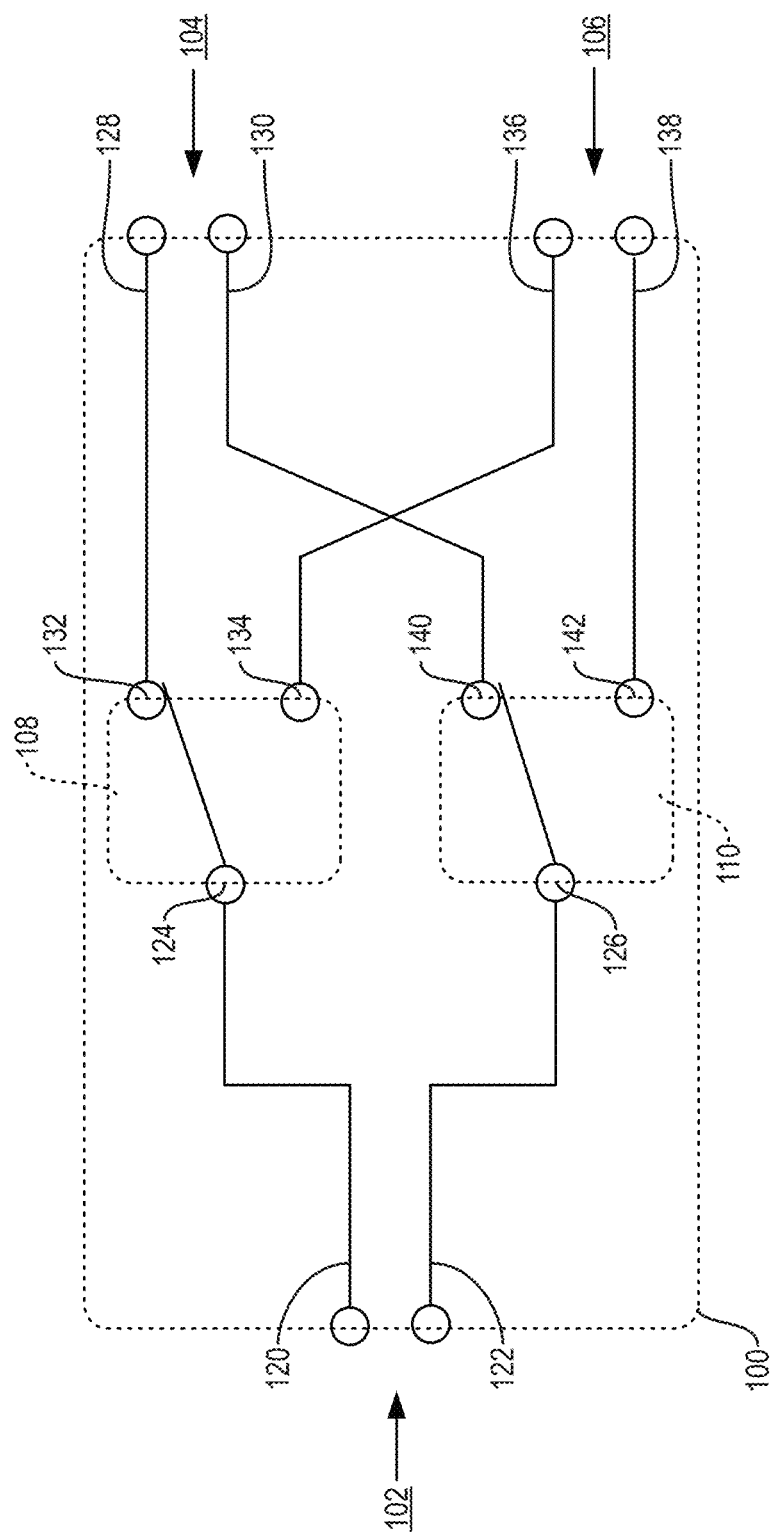
FIG. 1B illustrates a more detailed view of the switch device presented in FIG. 1A.

FIG. 1B illustrates a more detailed view of the switch device 100 presented in FIG. 1A. The differential input port 102 comprises a first conductor 120 and a second conductor 122. The first conductor 120 couples the input port 102 to the input 124 of the first switch 108, and the second conductor 122 couples the input port 102 to the input 126 of the second switch 110. The first output port 104 of the switch device 100 comprises a third conductor 128 and a fourth conductor 130. The third conductor 128 couples the first output port 104 to a first output 132 of the first switch 108, and the fourth conductor 130 couples the first output port 104 to a first output 140 of the second switch 110. The second output port 106 of the switch device 100 comprises a fifth conductor 136 and a sixth conductor 138. The fifth conductor 136 couples the second output port 106 to a second output 134 of the first switch 108, and the sixth conductor 138 couples the second output port 106 to a second output 142 of the second switch 110.

The depiction of the switch device 100 shown in FIGS. 1A and 1B are schematic only and are not intended to provide a physical and spatial representation. As described herein, the example embodiments implement a layout so that the distance and path orientation of (i) the differential path from input port 102 to first output port 104 through first switch 108 and second switch 110 is substantially the same as (ii) the differential path from input port 102 to second output port 106 through first switch 108 and second switch 110.

Figure 2A:
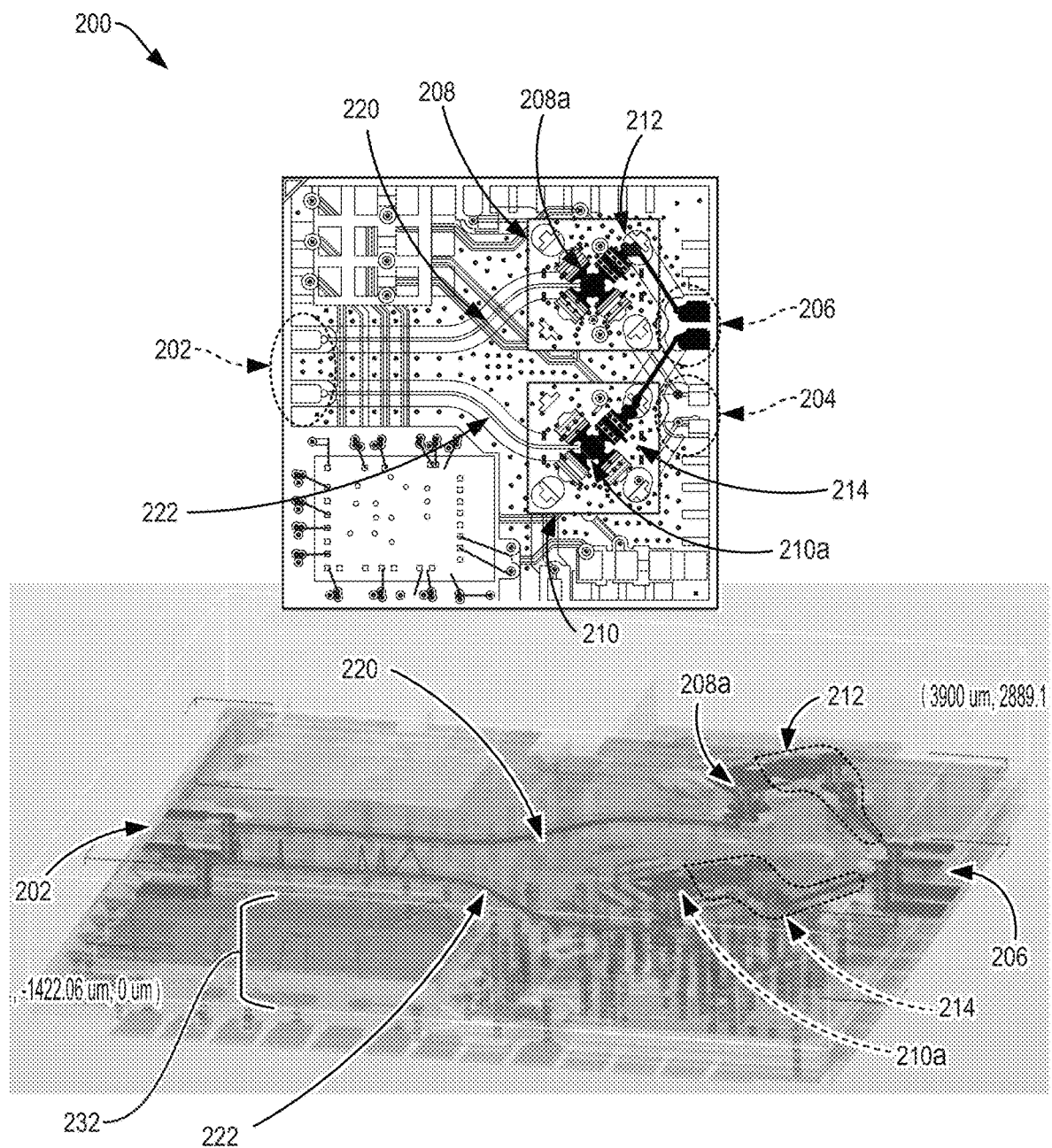
FIGS. 2A and 2B illustrate three-dimensional (3D) views of an example embodiment of the switch device.
Figure 2B:
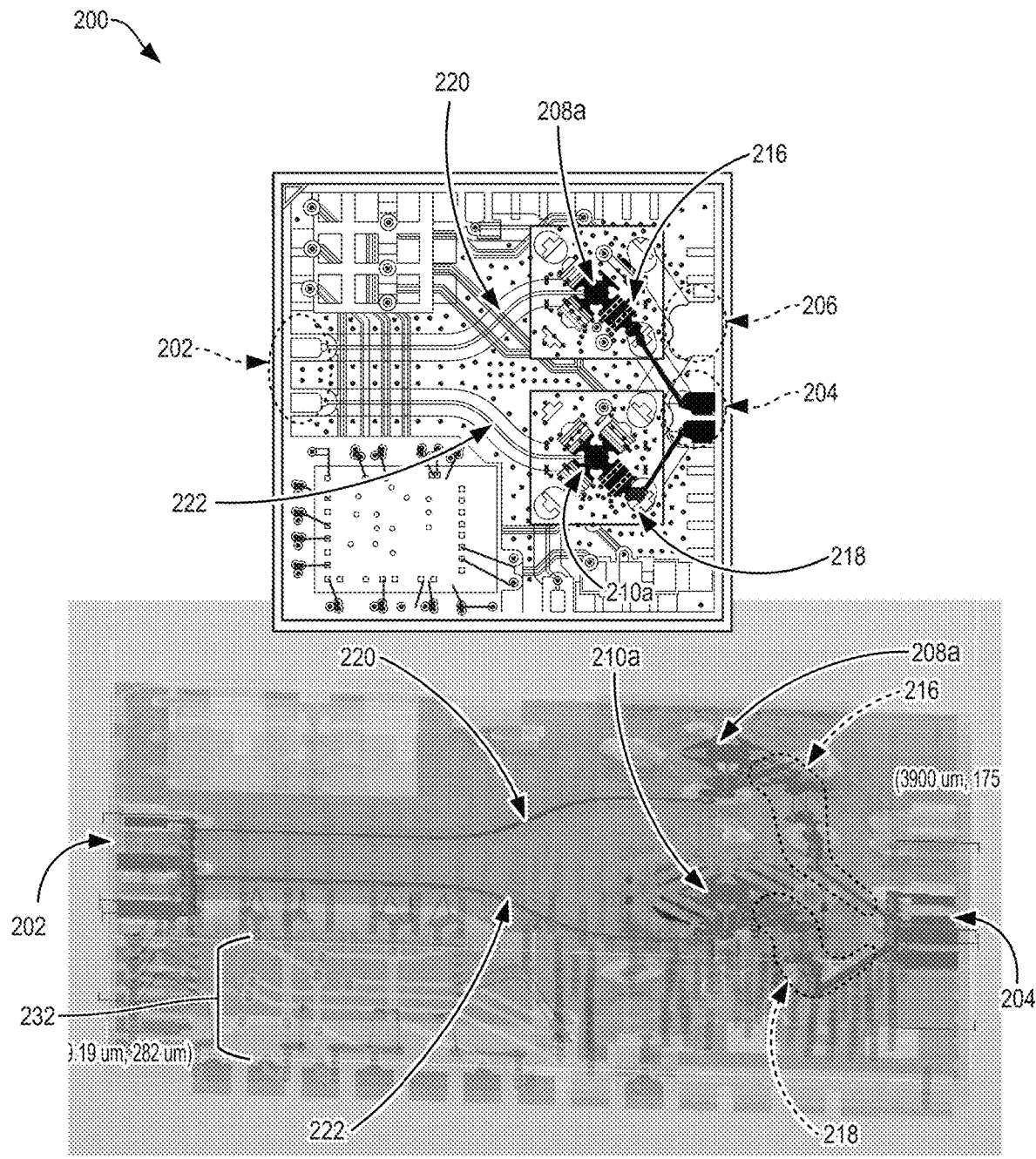
Figure 2C:
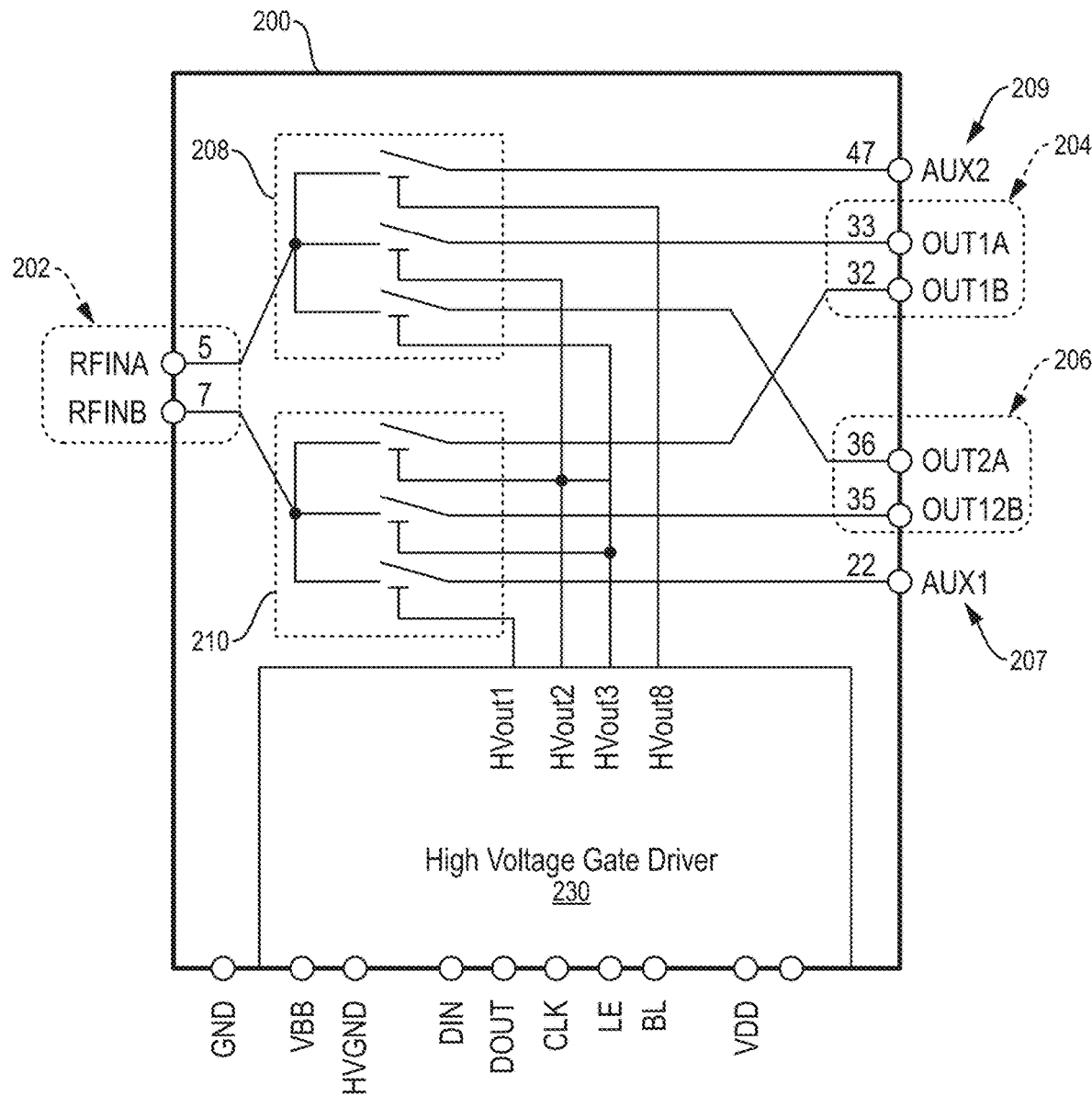
FIG. 2C schematically illustrates a physical signal path layout of the switch configurations of FIGS. 2A and 2B.

FIGS. 2A and 2B illustrate three-dimensional (3D) views of an example embodiment of the switch device 200. The embodiment shown in FIGS. 2A and 2B presents a physical signal path (i.e., transmission path) layout of the switch configuration that is shown schematically in FIG. 2C. Referring to FIG. 2C, the input port 202 is configured to receive a differential signal as described with respect to FIGS. 1A and 1B. Each complementary side of the differential signal is routed to a switch, but in this example embodiment each switch is a single pole four-throw (SP4T) switch, with three of the throws used and one throw unused. Two throws convey the differential signal to the first output 204 and the second output 206, as described with respect to FIGS. 1A and 1B. The third throw is used for auxiliary outputs 207, 209, and as previously mentioned, the fourth throw is unused. Note that the auxiliary outputs are driven independently by HVout1 and HVout8 from a driver integrated circuit (IC) 230, while HVout2 drives the input complementary differential signals to the first output port 204, and HVout3 drives the input complementary differential signals to the second output port 206.

FIG. 2A shows the electrical path when switches 208, 210 direct the differential signals from the input port 202 to second output port 206. FIG. 2B shows the electrical path when switches 208, 210 direct the differential signals from the input port 202 to first output port 204. In both FIGS. 2A and 2B, the top portion of the drawings shows a top view of the switch device 200, and the bottom portion depicts a 3D view of the switch device 200 that shows the various layers of the device, described in more detail herein.

The top portions (i.e., top views) of FIGS. 2A and 2B show the switch pads 208a, 210a for facilitating external electrical connection of MEMS switches 208, 210. FIG. 2A shows the signal paths 212, 214 from the each of the switches 208, 210, respectively, exiting the switch pad from the upper-right quadrant of the switch pad 208a, 210a, corresponding to one of the four throws of the SP4T MEMS switches. FIG. 2B shows the signal path 216, 218 from the each of the switches 208, 210, respectively, exiting the switch pad from the lower-right quadrant of the switch pad 208a, 210a, corresponding to a second one of the four throws of the SP4T MEMS switches.

The top portions of FIGS. 2A and 2B show the signal paths 220, 222 from the input port 202 to the switch pads 208a, 210a, respectively, are substantially the same length and symmetrically shaped.

The bottom portion of FIG. 2A shows that the paths 212, 214 from the respective switch pad 208a, 210a, which pass down through the layers 232 of the switch device 200 to the second output port 206, are substantially the same. Each individual layer of the layers 232 are illustrated in FIGS. 6A through 6F.

The bottom portion of FIG. 2B shows that the paths 216, 218 from the respective switch pad 208a, 210a, which pass down through the layers 232 of the switch device 200 to the first output port 204, are substantially the same. Further, comparing the bottom portions of FIGS. 2A and 2B shows that the paths from the switch pads 208a, 210a to the second output port 206 are substantially the same as the paths from switch pads 208a, 210a to the first output port 204. The only difference is the direction from which the signal paths exit the switch pads. As set forth herein, signal paths 212, 214 exit switch pads from the upper-right quadrant, while signal paths 216, 218 exit the switch pads from the lower-right quadrant. Because the MEMS switches 208, 210 are symmetrical, however, the direction from which a signal exits the MEMS switch has little or no effect on the electrical characteristics of the signal path. The symmetrical MEMS switches 208, 210 are configured with the switch pole at the center of the switch device, with each of the throws occurring outward from the center pole, symmetrically about the perimeter of the switch.

Figure 3A:
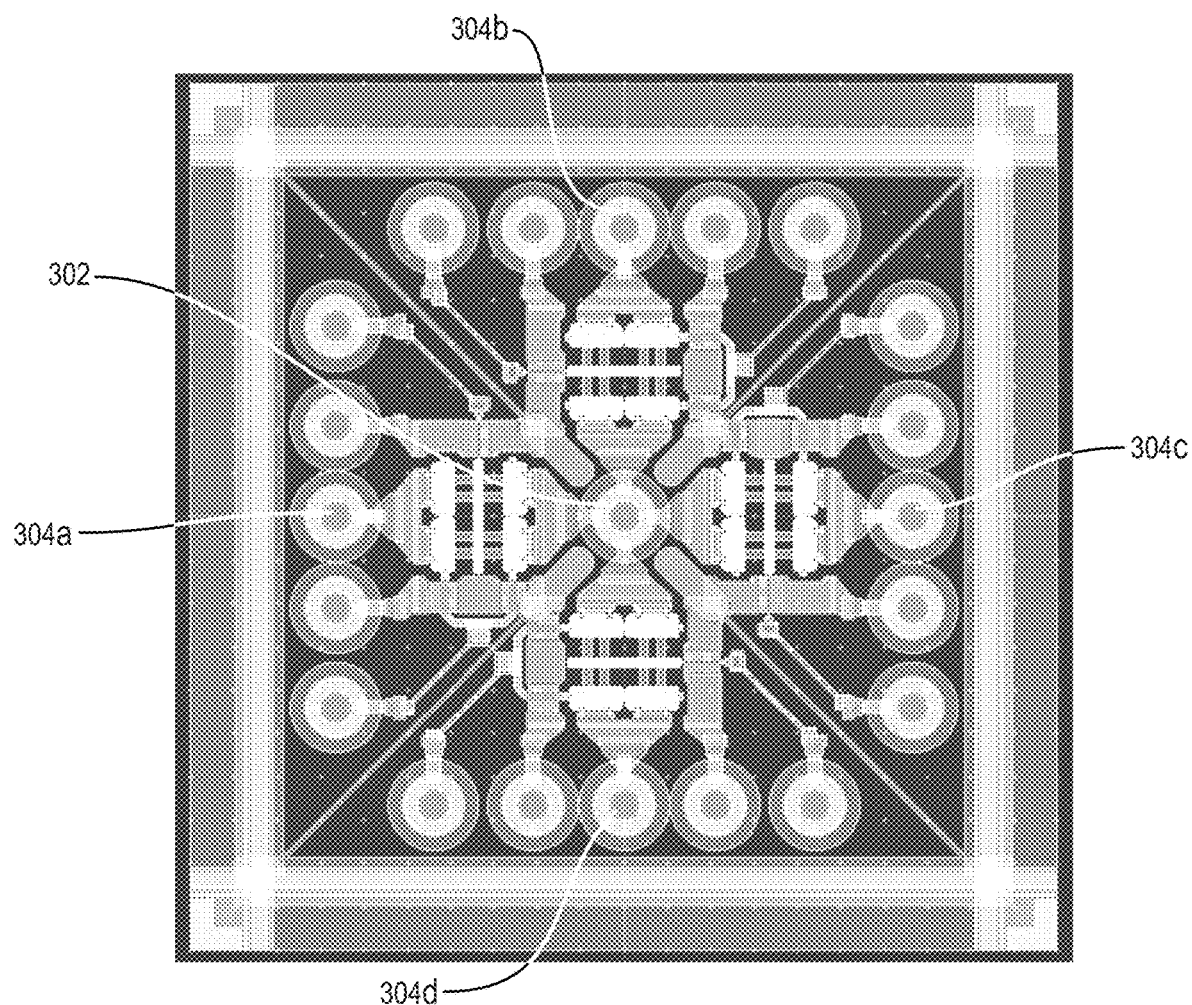
FIG. 3A shows a top view of an example symmetrical single-pole, four-throw (SP4T) MEMS switch according to the described embodiments.
Figure 3B:
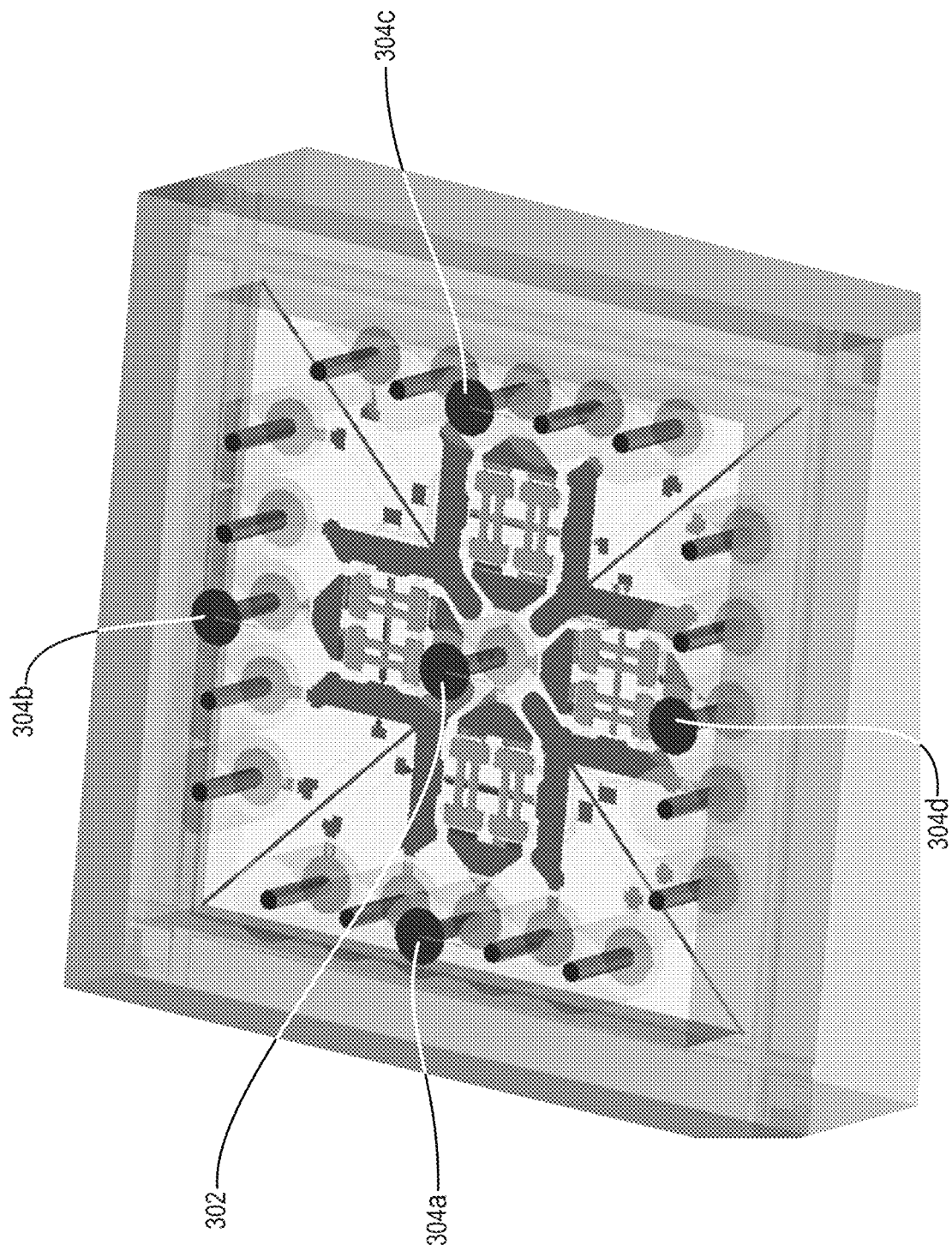
FIG. 3B shows an isometric view of the SP4T MEMS switch depicted in FIG. 3A.

An example symmetrical single-pole, four-throw (SP4T) MEMS switch is shown in a top view in FIG. 3A, and in an isometric view in FIG. 3B. The pole of the switch is situated centrally, with the four throws distributed symmetrically about the pole (to the top of the pole, to the bottom of the pole, to the left of the pole, and to the right of the pole). A pole via 302 is situated in the package glass cap directly above the pole port of the SP4T switch. Throw vias 304a, 304b, 304c, 304d are situated at each of the respective throw ports.

As shown in FIGS. 2A and 2B, the most aggressive signal bending occurs at the signal jump to different elevation/layers. This bending is acceptable because when the signal exits the vertical via, the signal transition is the same regardless of which direction the signal is routed from the via to the horizontal plane. In the example embodiment, bending that is implemented on the same layer only happens on the paths from the differential input port to the two MEMS switches. The use of inter-layer routing across the multi-layer architecture facilitates a very dense routing layout with excellent flexibility.

The example embodiment shown in FIGS. 2A and 2B thus implements symmetrical paths from the input port 202, through matched MEMS switches 208, 210 through the layers 232 of the switch device 200 to the output ports 204, 206. The path lengths are substantially the same, and the path shape and spatial (i.e., physical) orientation through the device are substantially the same, thereby creating what are essentially matched radio frequency (RF) paths from the input port 202 to the output ports 204, 206. As used herein, spatial orientations of signal paths being "matched" means that the signal paths have substantially the same length and are similarly distributed in three-dimensions through the device. The electrical characteristics of these matched RF paths are substantially the same.

Figure 4A:
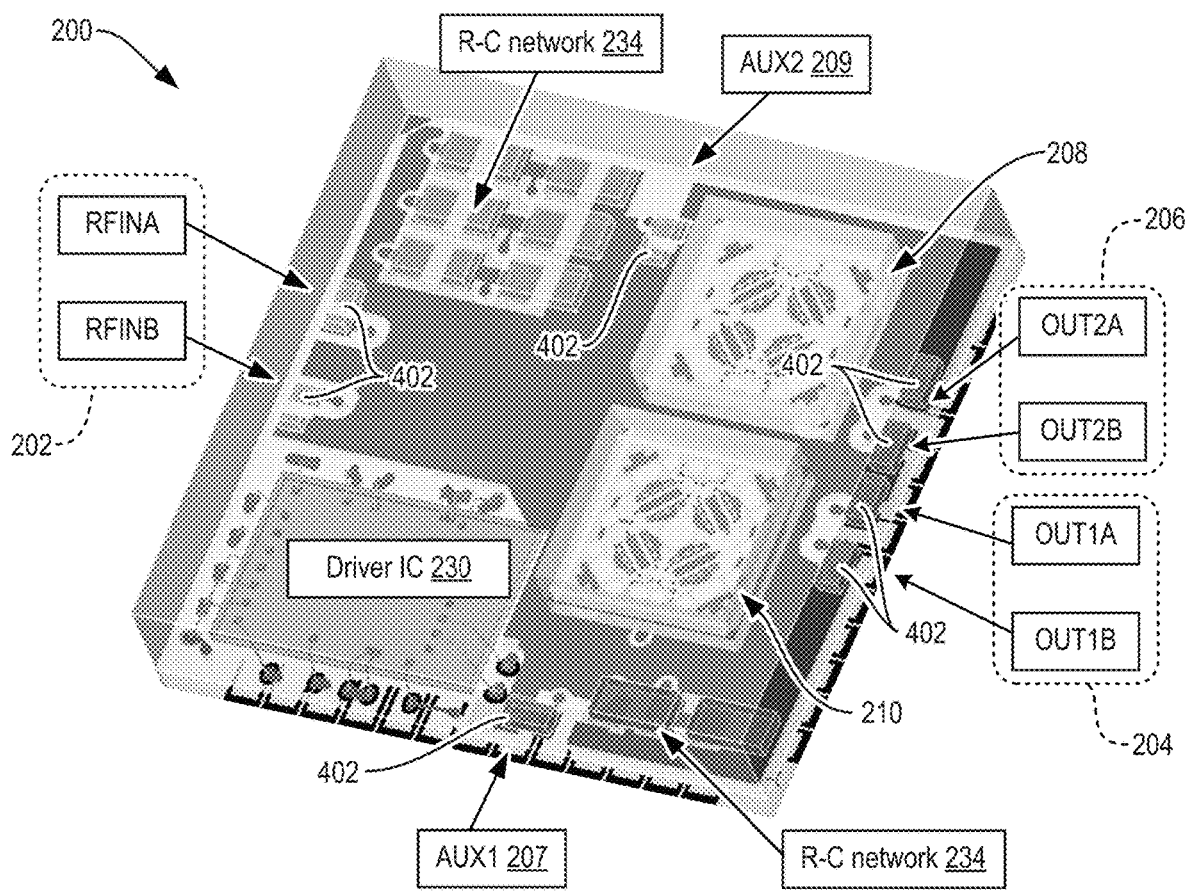
FIG. 4A illustrates an isometric view of an example embodiment of the switch device described herein.
Figure 4B:
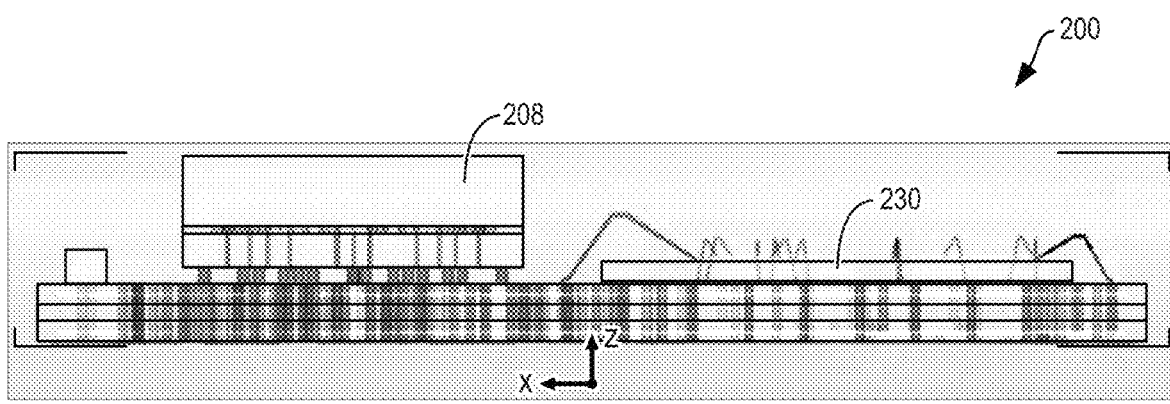
FIG. 4B shows a side view of the switch device described herein.

FIG. 4A illustrates an isometric view of another example embodiment of the switch device 200 described herein. MEMS switches 208, 210 are shown mounted on the top surface of the switch device 200. Input port 202, first output port 204, and second output port 206 are shown with electrostatic discharge (ESD) protection devices 402 associated with each port. A driver integrated circuit (IC) 230 provides the actuation signals to the MEMS switches 208, 210. FIG. 4A further shows resistor-capacitor (R-C) networks 234 that may be used for signal conditioning on the switch device 200. FIG. 4B shows a side view of the switch device 200. The layout of the example embodiment of a switch device 200 shows the input port 202 at the left edge of the switch device 200 and the output ports 204, 206 at the right edge of the switch device 200, which provides a convenient spatial signal flow across the device 200.

Figure 5:
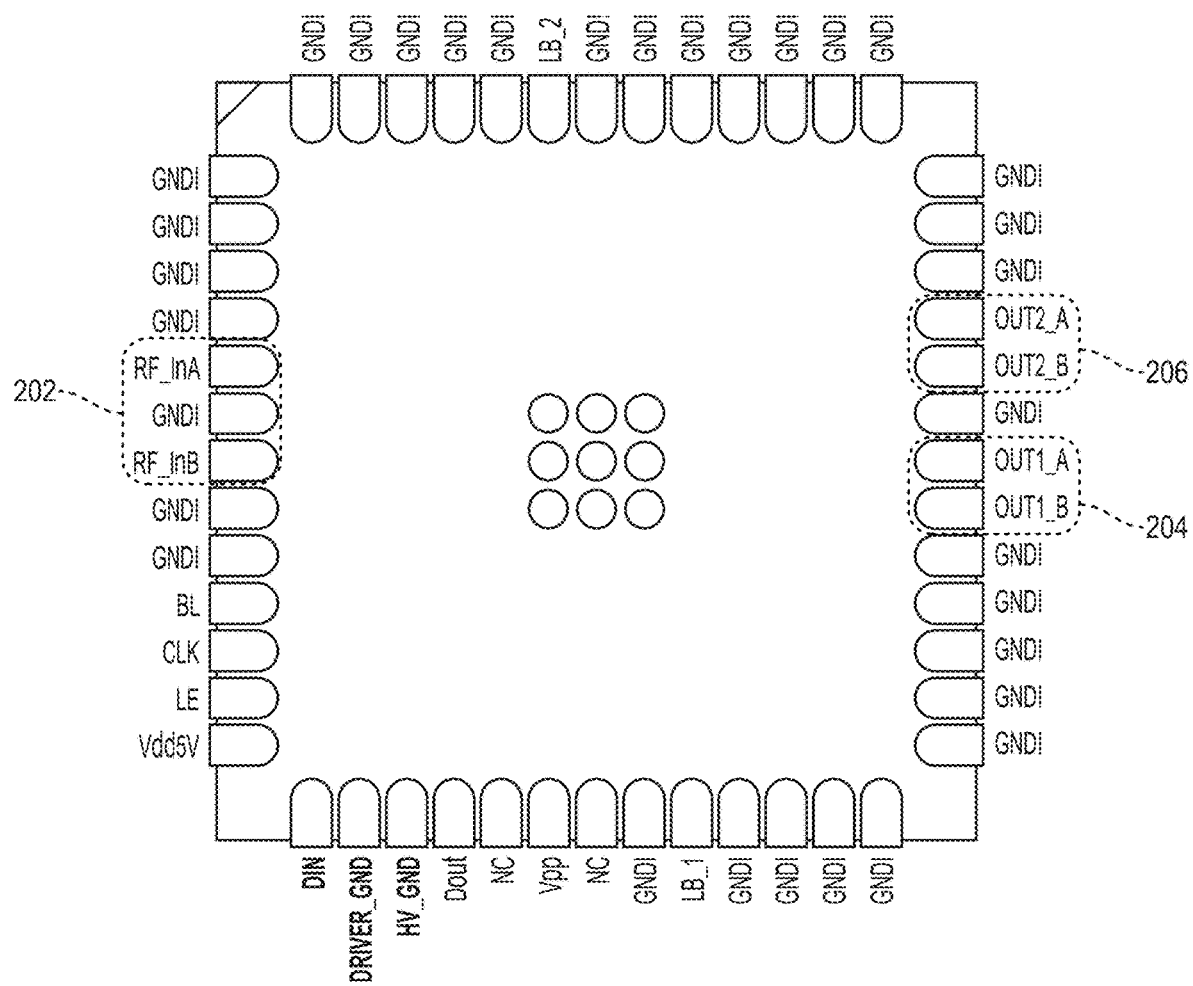
FIG. 5 illustrates a bottom view of the example switch device.
Figure 6A:
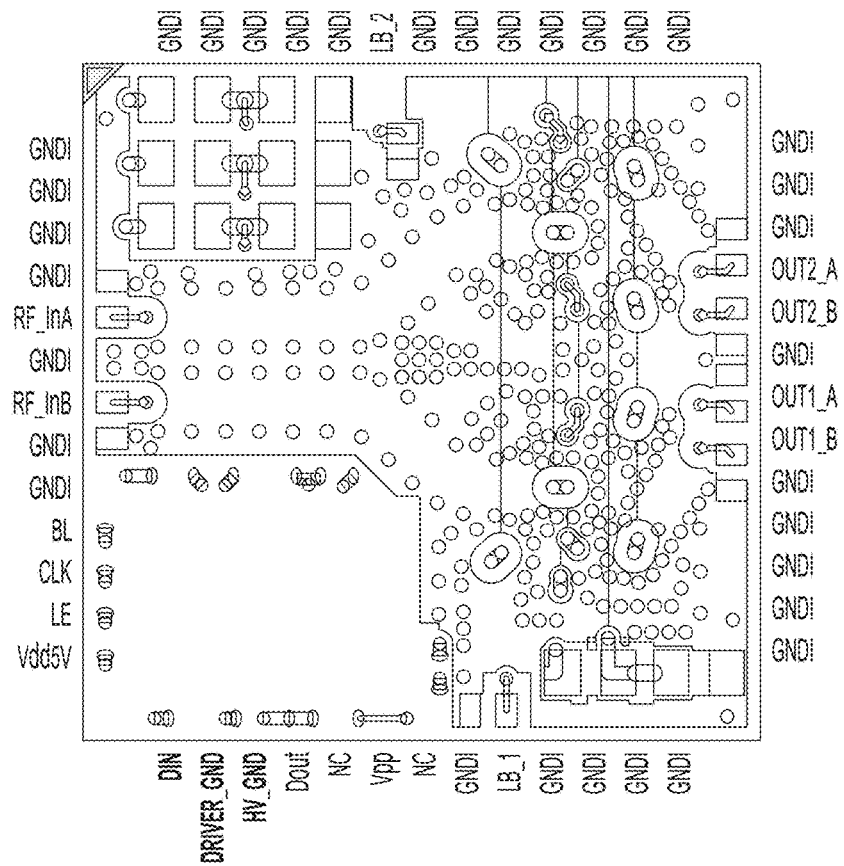
FIGS. 6A through 6F illustrate the individual circuit layers of the switch device.
Figure 6B:
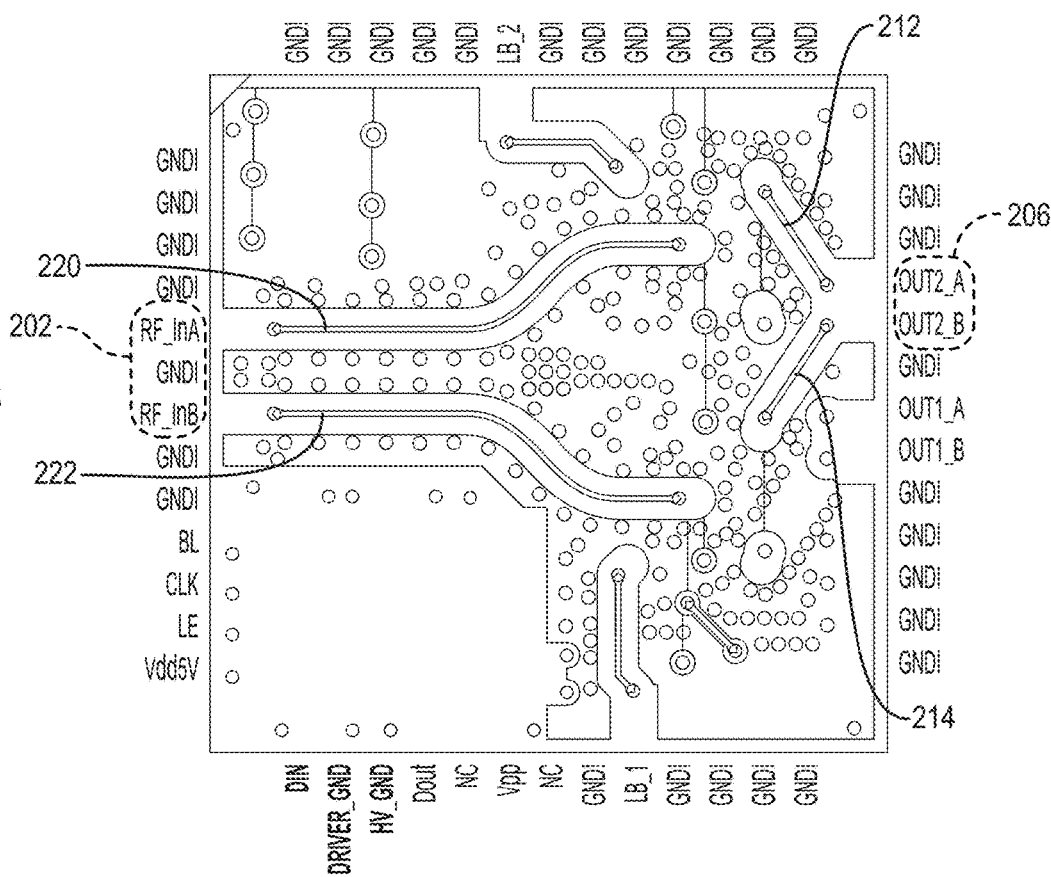
Figure 6C:
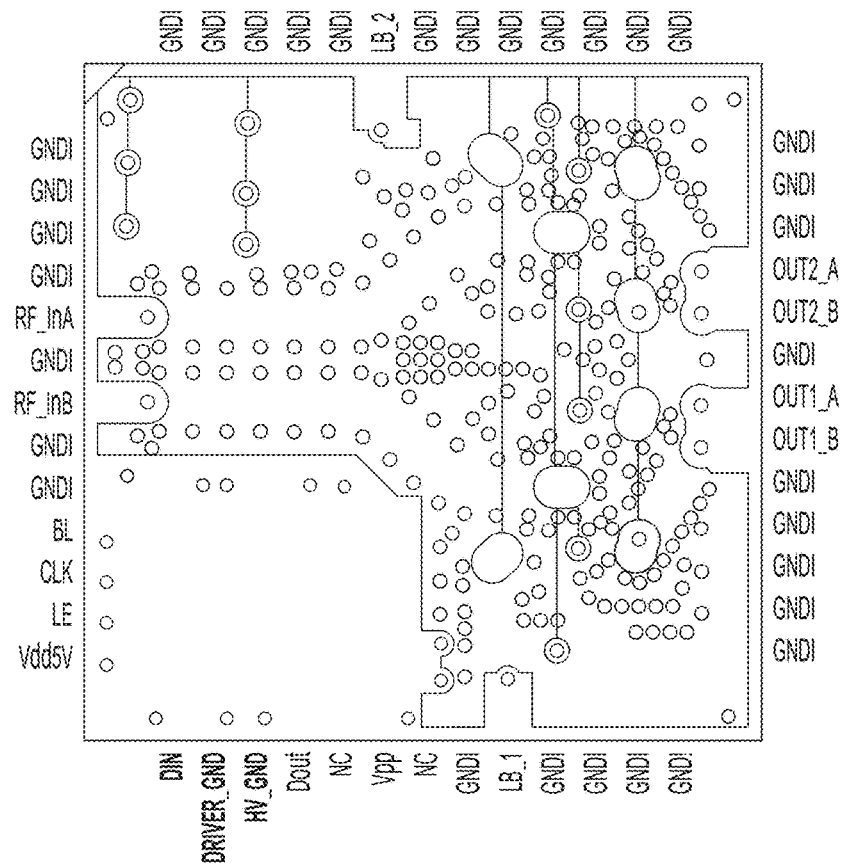
Figure 6D:
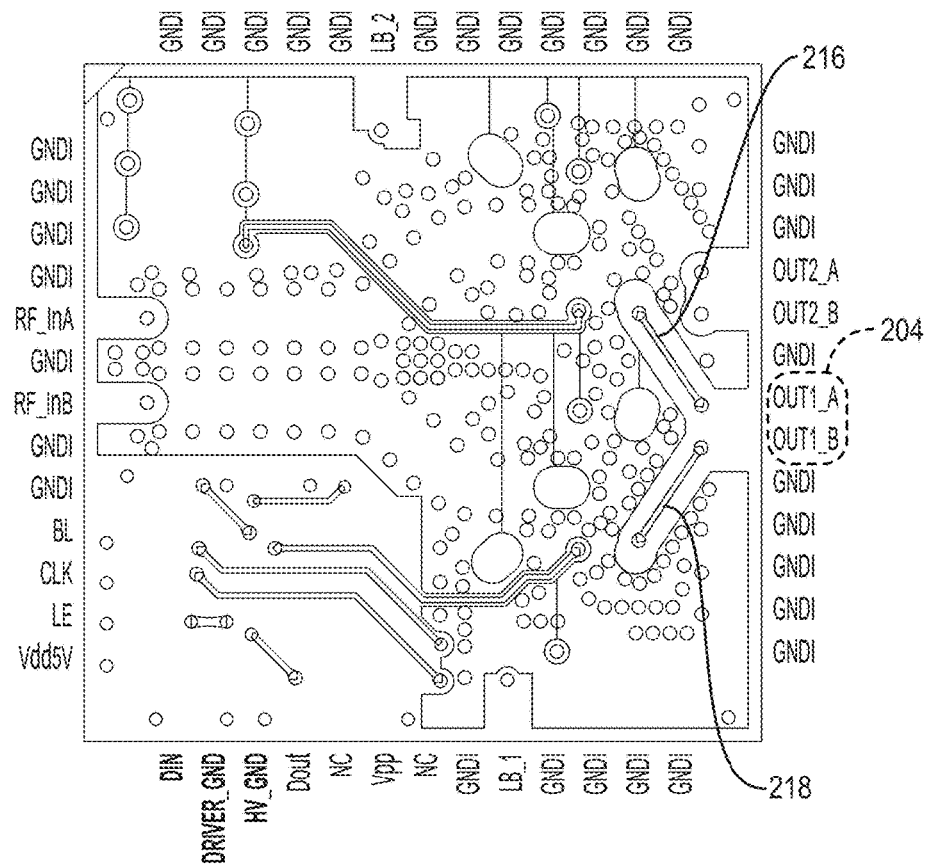
Figure 6E:
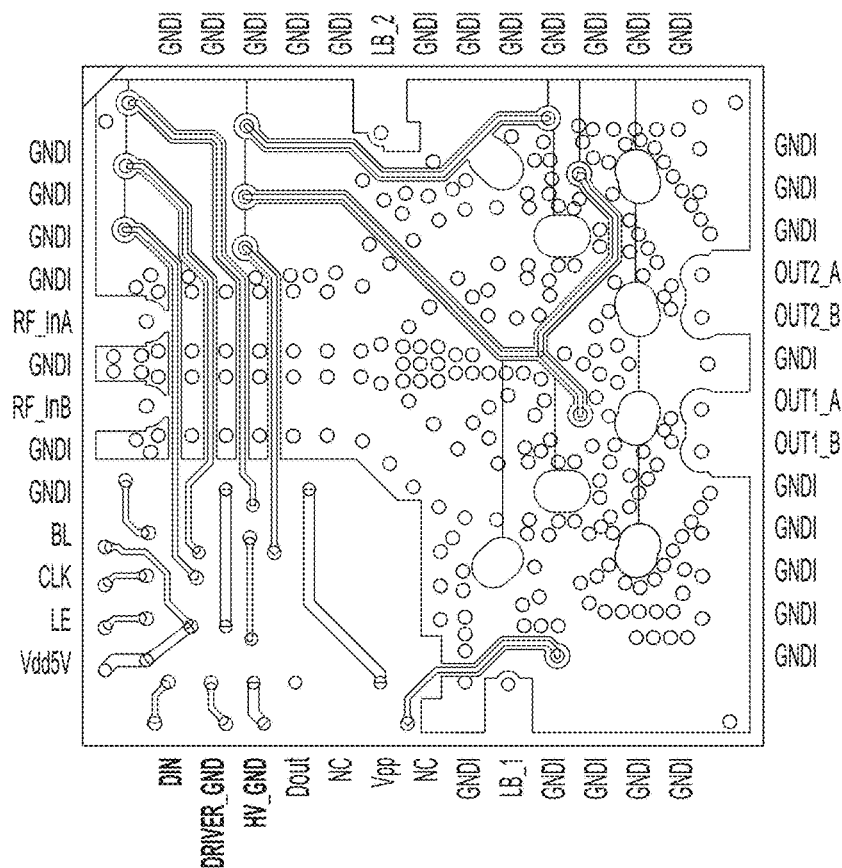
Figure 6F:
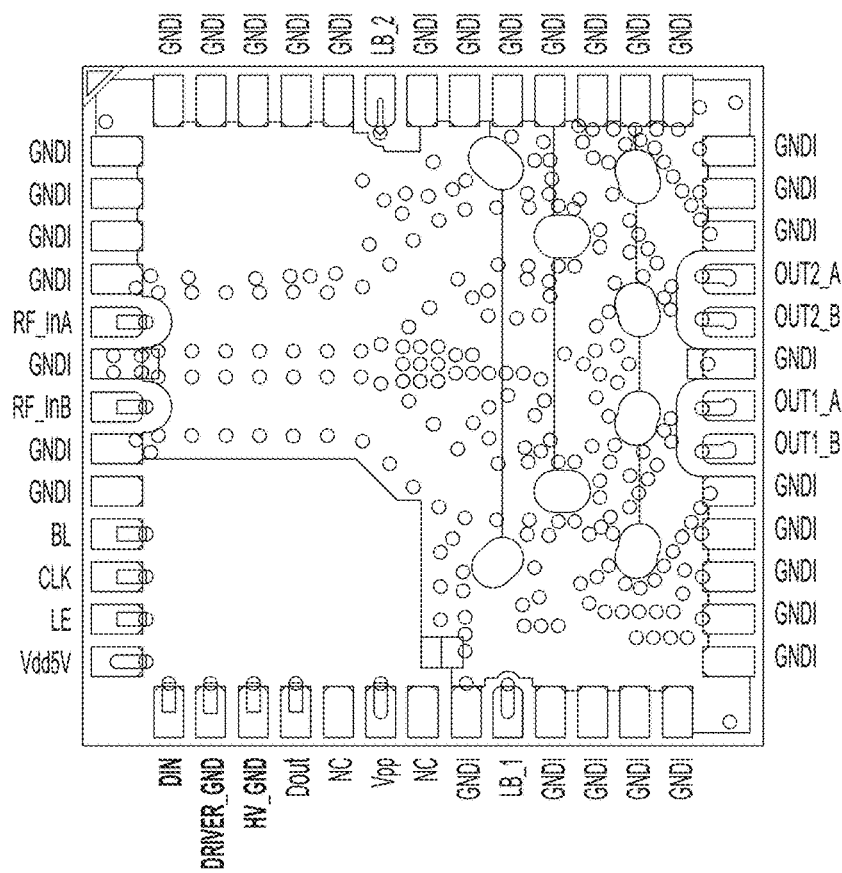

FIG. 5 illustrates a bottom view of the example switch device 200, identifying device pin-out information. FIGS. 6A through 6F illustrate the individual circuit layers 232 of the switch device 200. The layers are separated from one another by a layer of dielectric material. FIG. 6A depicts the top-most layer of the switch device 200 (i.e., the layer upon which the MEMS switches 208, 201, the driver IC 230, and other components are mounted). FIG. 6B is the next lower layer from the top-most layer, and so on through the bottom layer, which is shown in FIG. 6F.

Figure 7:
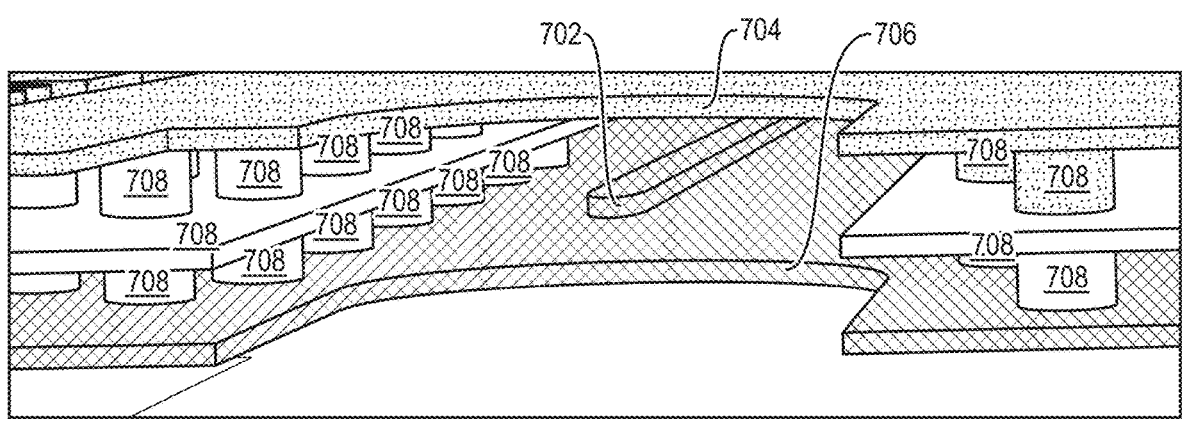
FIG. 7 provides a 3D view of the encapsulated signal path as described herein.

The layers 232 are arranged so that signal traces that propagate high frequency signals are surrounded above and below by conductive reference planes. For example, FIG. 6B shows signal paths 220, 222 from the input port to the MEMS switches 208, 210. The layer above, shown in FIG. 6A, and the layer below, shown in FIG. 6C, provide solid reference planes that encapsulate the signal paths 220, 222. Further, fences of electrically conductive vias are implemented along both sides of the signal paths 220, 222. The vias extend from the conductive plane above the signal paths 220, 222 to the conductive plane below the signal paths. FIG. 7 provides a 3D view of the encapsulated signal path 702, with a conductive reference plane 704 above, and a conductive reference plane 706 below the path 702. Conductive vias 708 are shown providing a conductive barrier fence on either side of the signal path 702. This via fence, along with the conductive reference planes above and below the signal paths, facilitates a controlled impedance along the paths—an impedance of 50 ohms in the example embodiment described herein, although other impedances may be implemented. Using the techniques described herein, the controlled (e.g., 50 ohm) impedance can be maintained from input port to MEMS switches and from MEMS switches to output ports, resulting in low reflection and insertion loss on the signal paths.

Figure 8A:
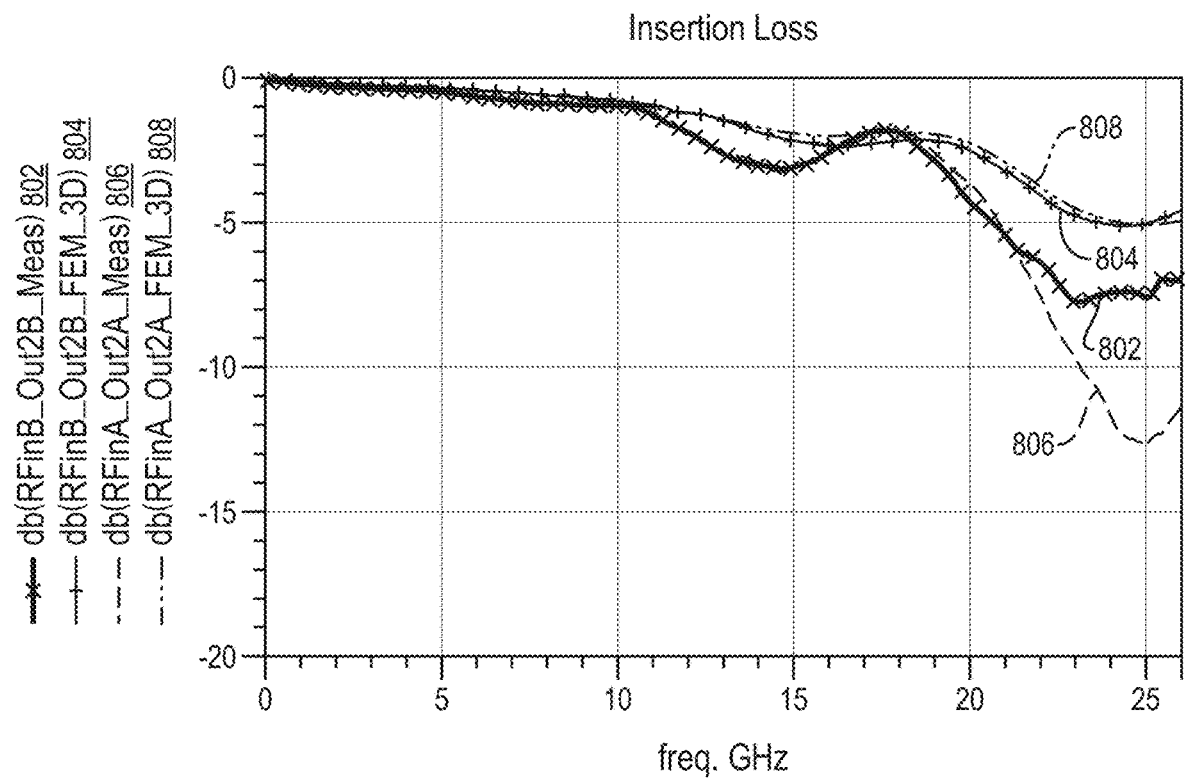
FIGS. 8A, 8B, 9A, 9B, 10A, 10B, and 10C illustrate various experimental results for the example embodiment described herein.
Figure 8B:
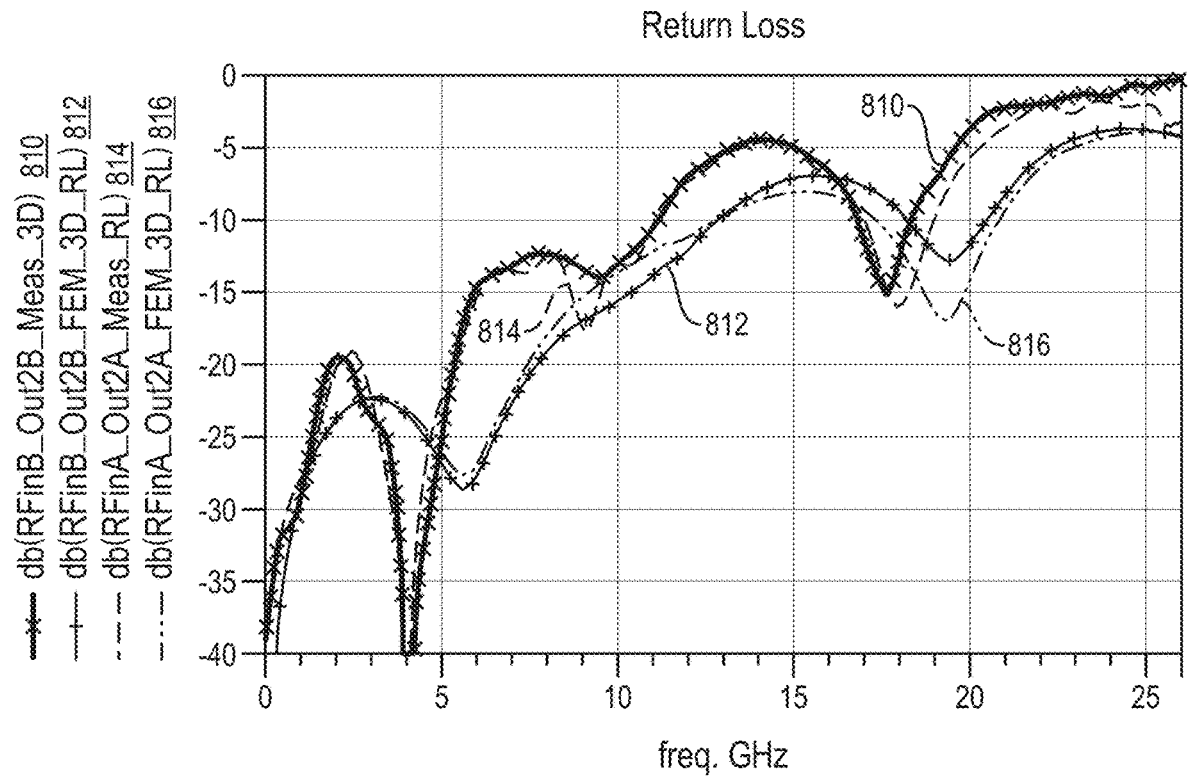

FIGS. 8A, 8B, 9A, 9B, 10A, 10B, and 10C illustrate experimental results for an example embodiment described herein. FIG. 8A shows insertion loss with respect to the first port (measured 802 and finite element method (FEM) 804), and with respect to the second port (measured 806 and FEM 808). FIG. 8B shows return loss with respect to the first port (measured 810 and finite element method (FEM) 812), and with respect to the second port (measured 814 and FEM 816). These results show that the measured values track well with the simulation values.

Figure 9A:
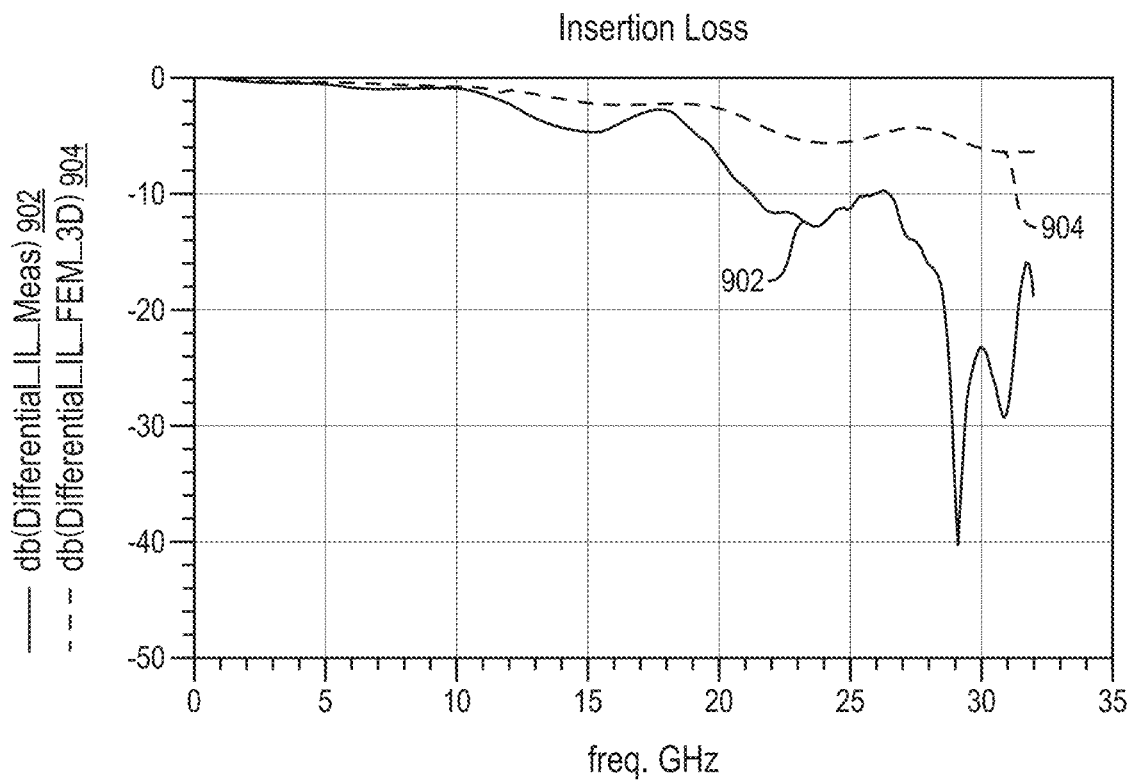
Figure 9B:
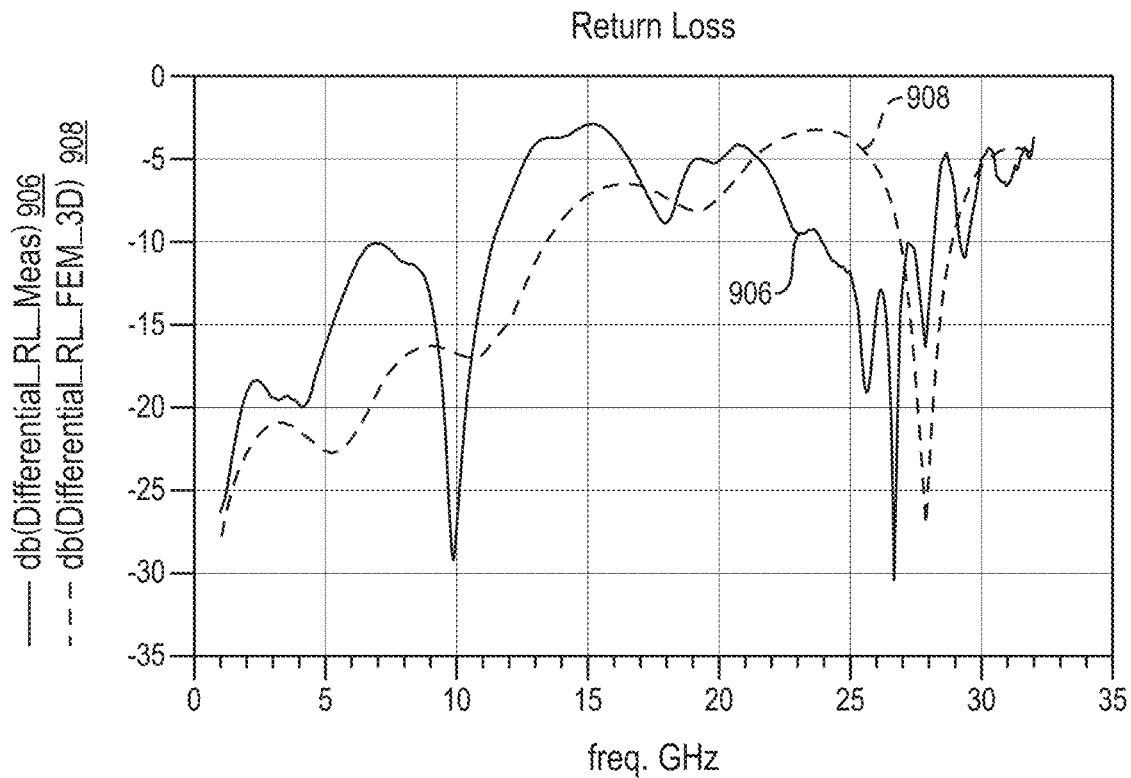

FIGS. 9A and 9B illustrate differential S-parameters of the same channel, 3D FEM simulation vs. measured values. FIG. 9A shows insertion loss ($S_{12}$) for measured 902 and FEM simulation 904 values. FIG. 9B shows return loss (S11) for measured 906 and FEM simulation 908 values. These results again show that the measured values track well with the simulation values.

Figure 10A:
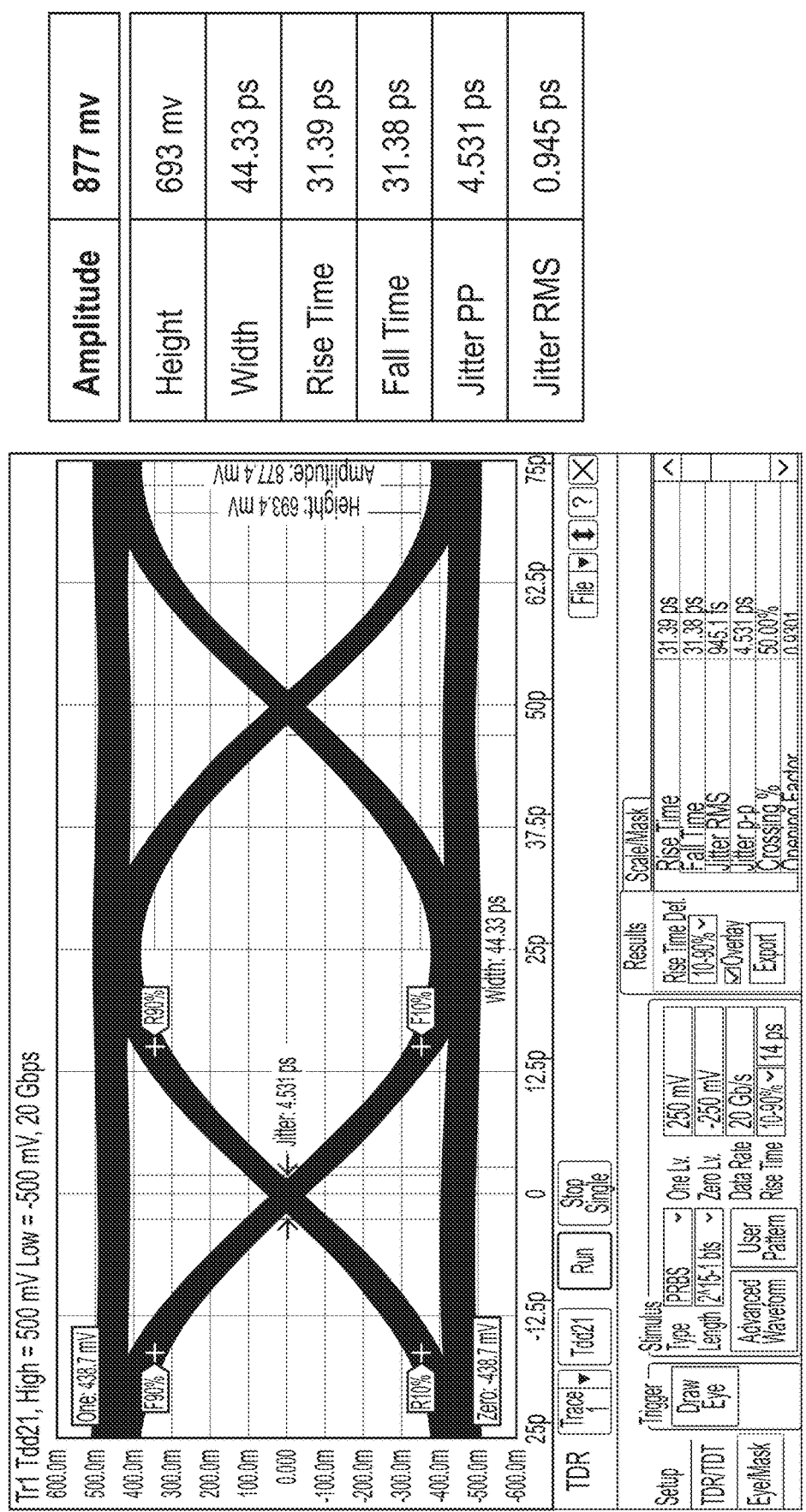
Figure 10B:
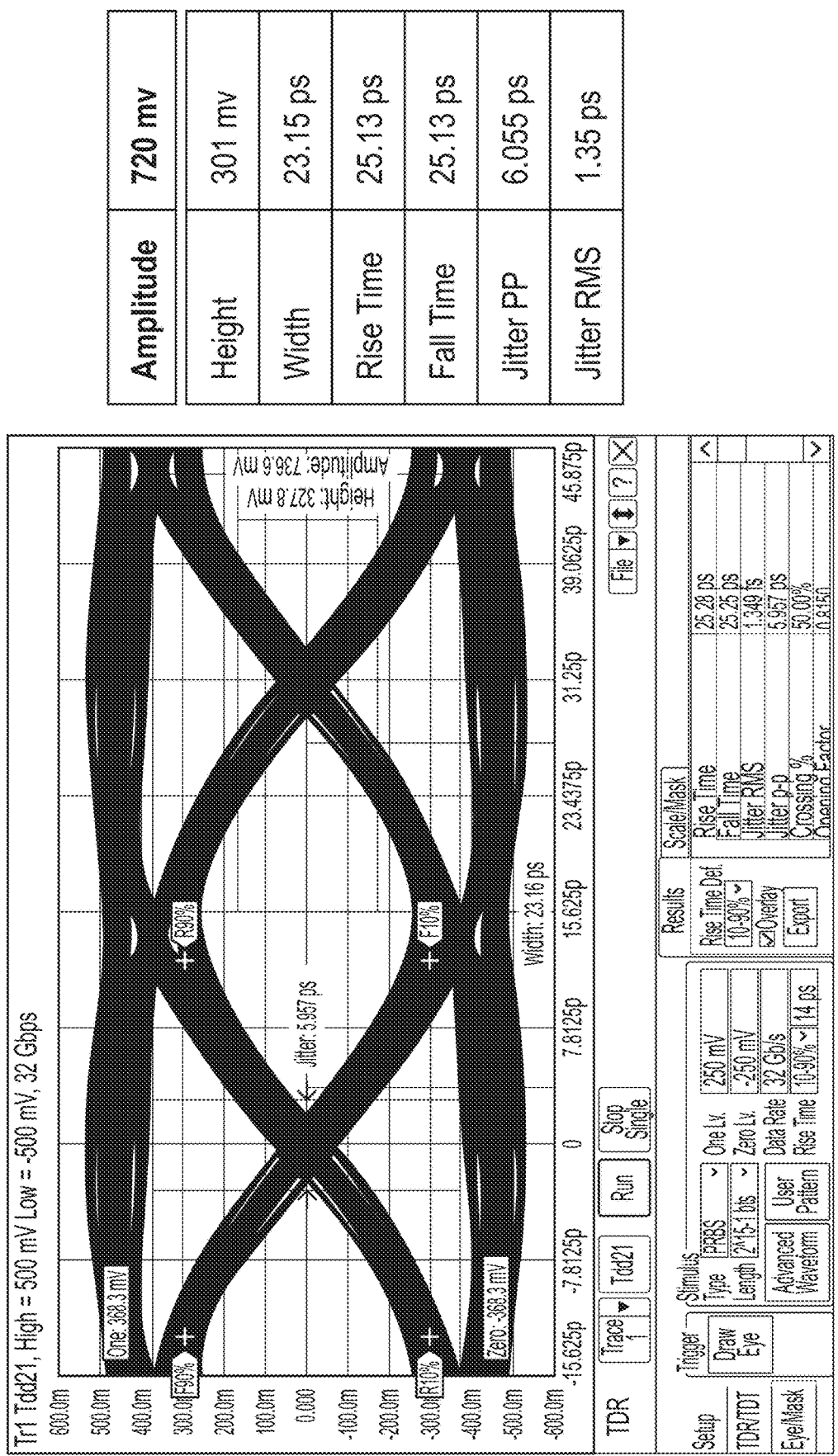
Figure 10C:
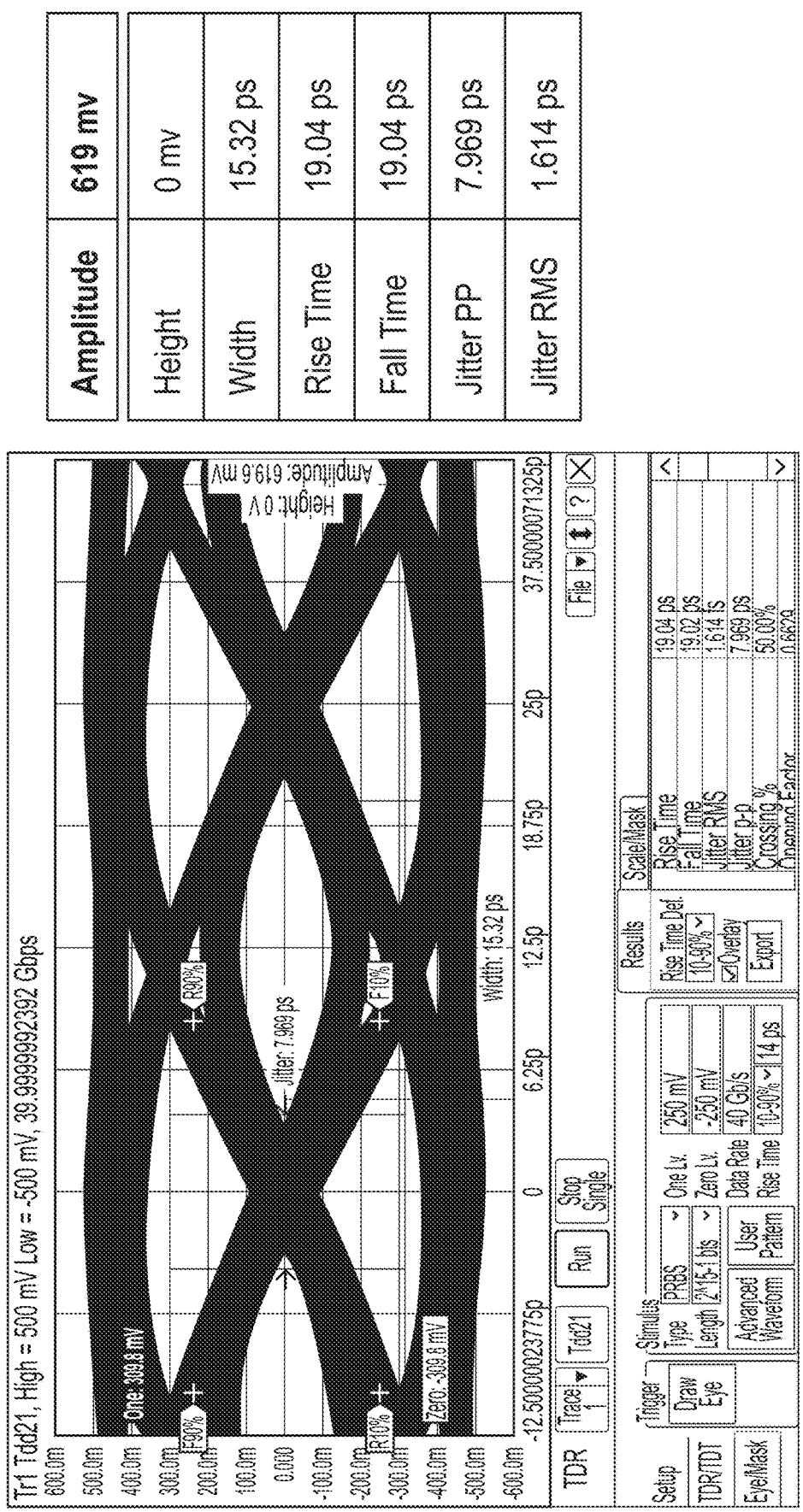

FIGS. 10A, 10B, and 10C illustrate eye diagrams for a non-return-to zero (NRZ) test signal at 20 Gbps (FIG. 10A), 32 Gbps (FIG. 10B) and 40 bps (FIG. 10C). These diagrams show that even at 40 bps the example embodiment produces an open, symmetrical eye pattern.

Figure 11:
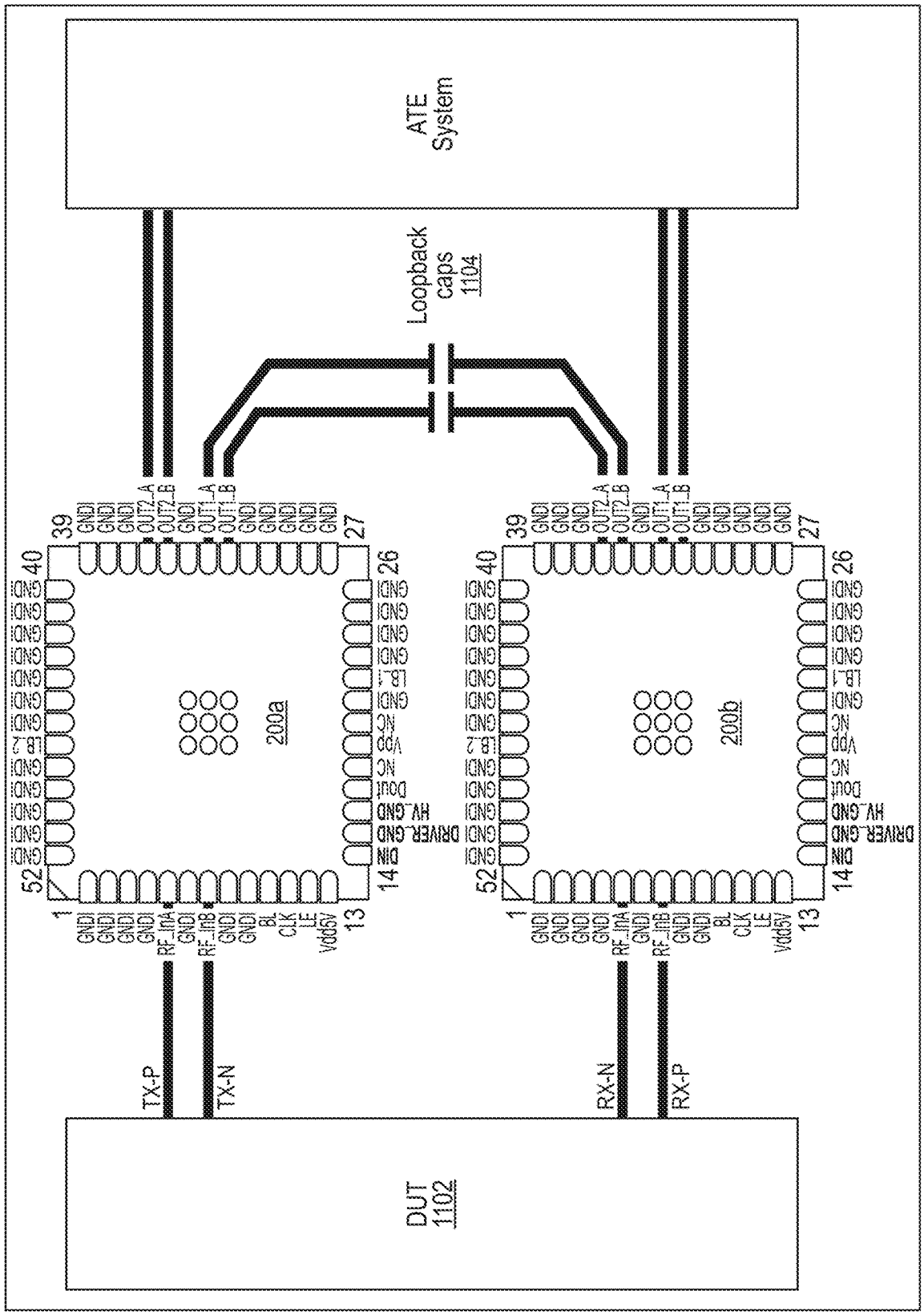
FIG. 11 shows an embodiment configured for use in applications with data rates up to the maximum specified for PCIe 5.0.

Another example embodiment, shown in FIG. 11, is designed for use in applications with data rates up to PCIe 5.0. In this embodiment, two instances 200a, 200b of the switch device 200 (shown in 3D view in FIGS. 2A and 2B, and schematically in FIG. 2C) are used to implement the external loopback test. For high-speed path (e.g., 32 Gbps), the differential output signals (TX-P, TX-N) from the DUT 1102 are routed through AC coupling capacitors 1104 (e.g., 200 nF) and then returned to the differential input signals (RX-P, RX-N) of the DUT 1102. The other differential paths to/from the DUT 1102 can be used for DC measurement or low-speed signals.

Figure 12:
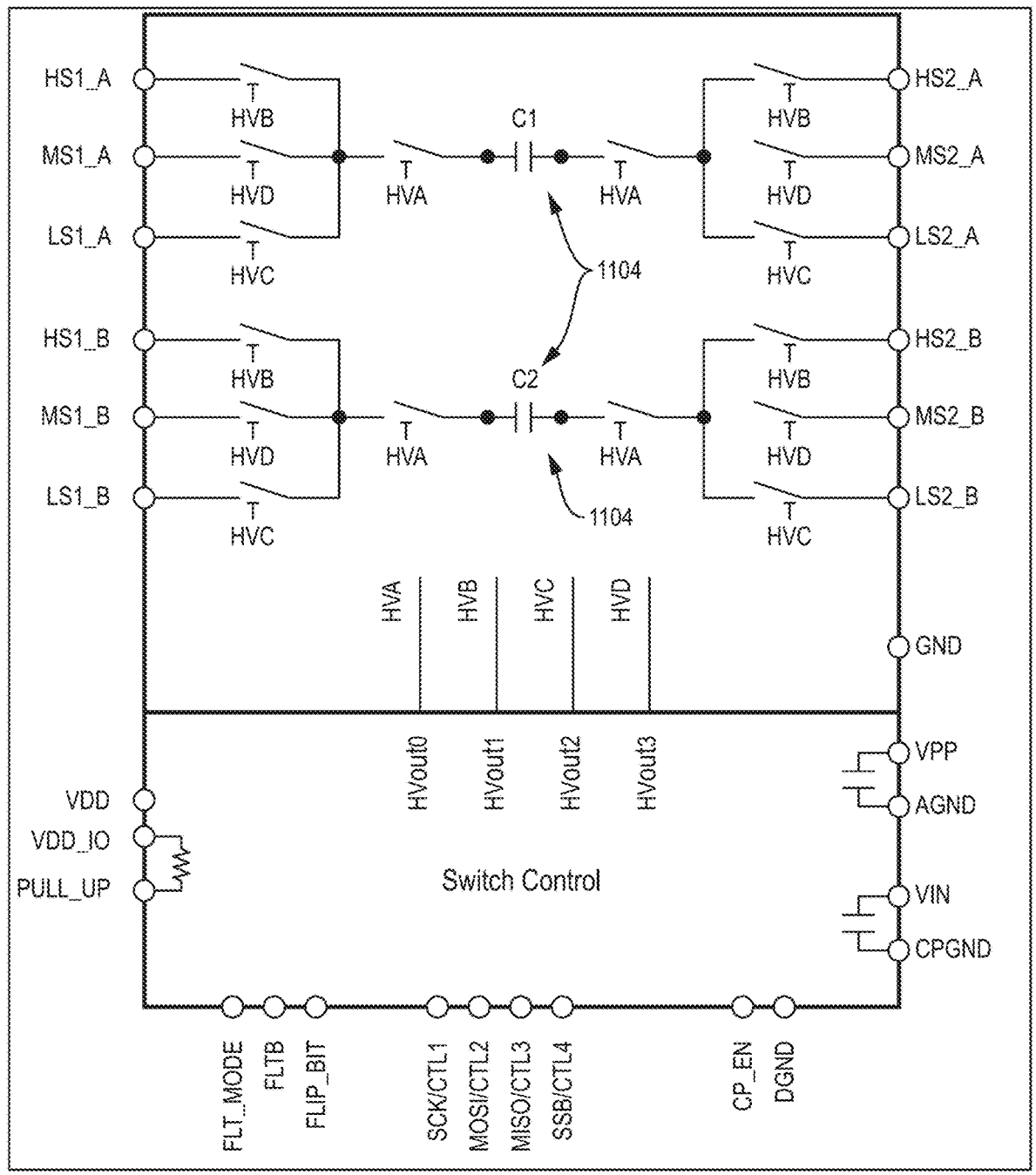
FIG. 12 shows a device that incorporates individual switch devices in a single package.

FIG. 12 shows a device 1200, which incorporates devices 200a and 200b in a single package. Device 1200 is shown with coupling capacitors 1104 connected as described in FIG. 11. Each switch control is labeled as HVA, HBV, HVC, or HVD.

Figure 13A:
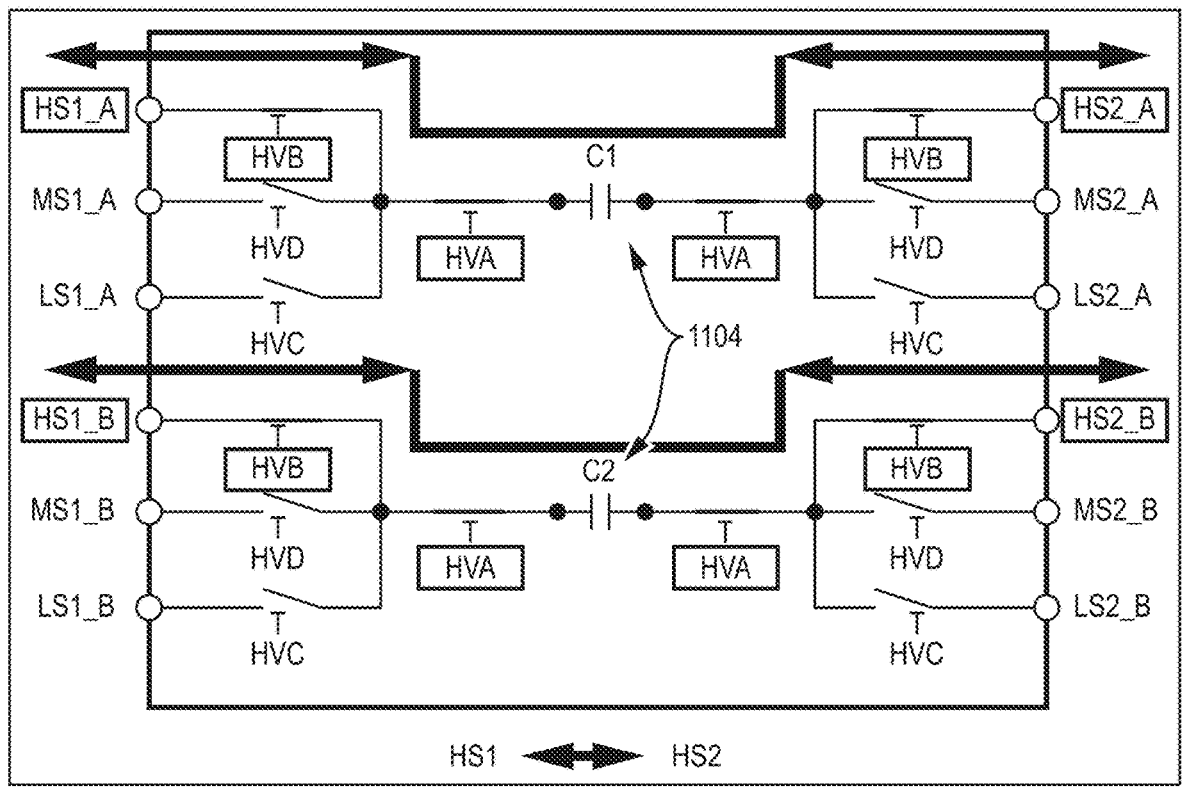
FIGS. 13A through 13F show various configurations of the switches in the device depicted in FIG. 12.
Figure 13B:
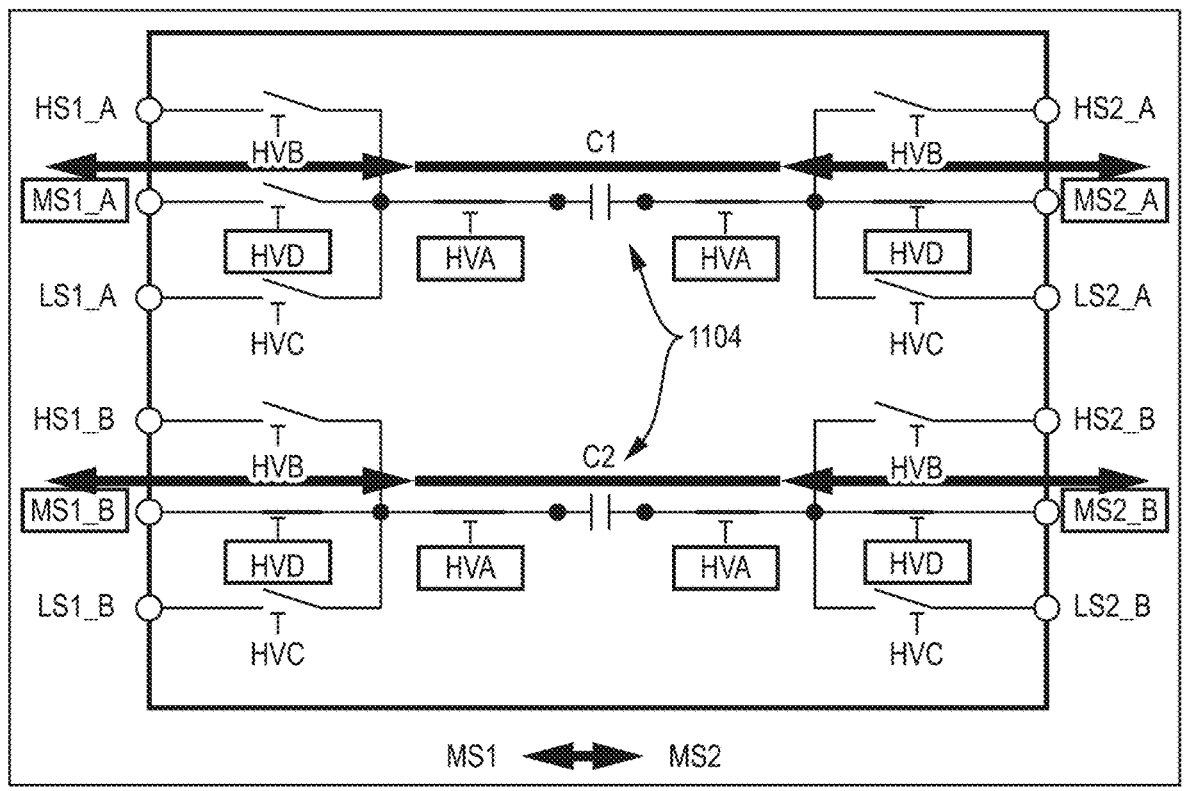
Figure 13C:
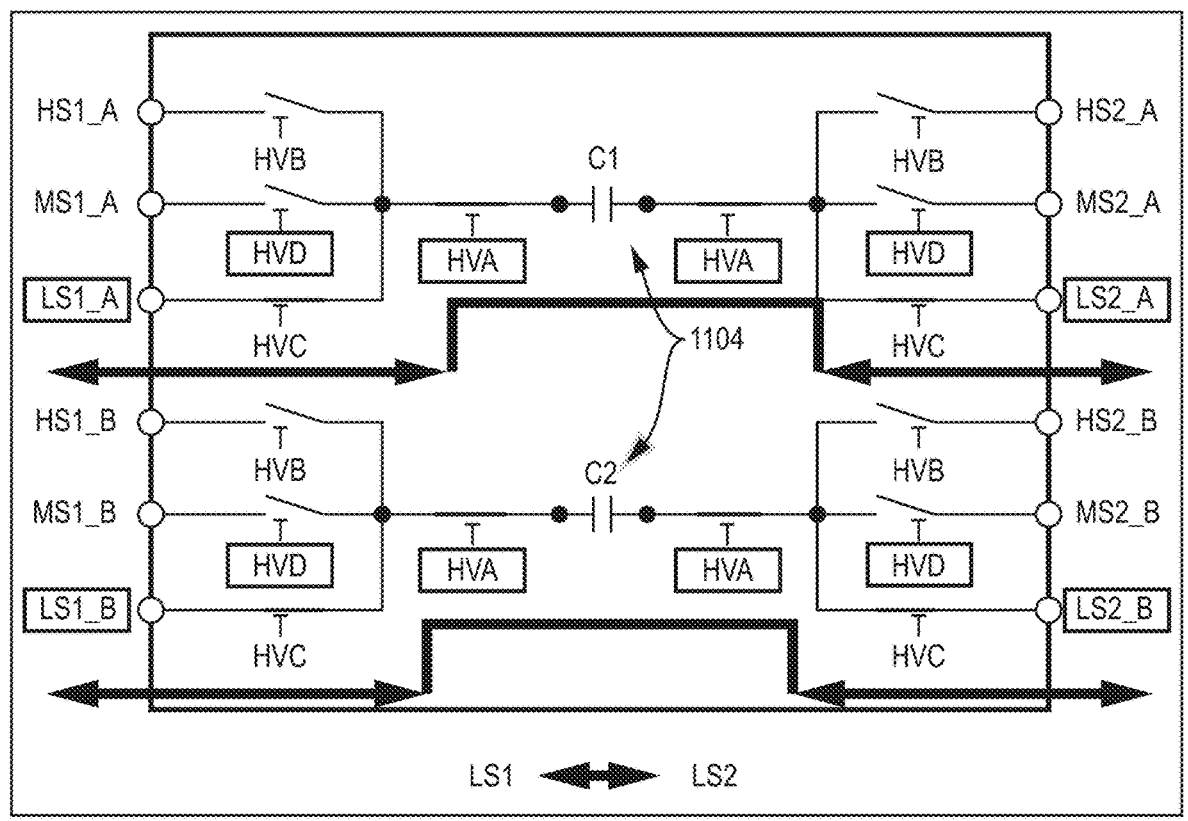
Figure 13D:
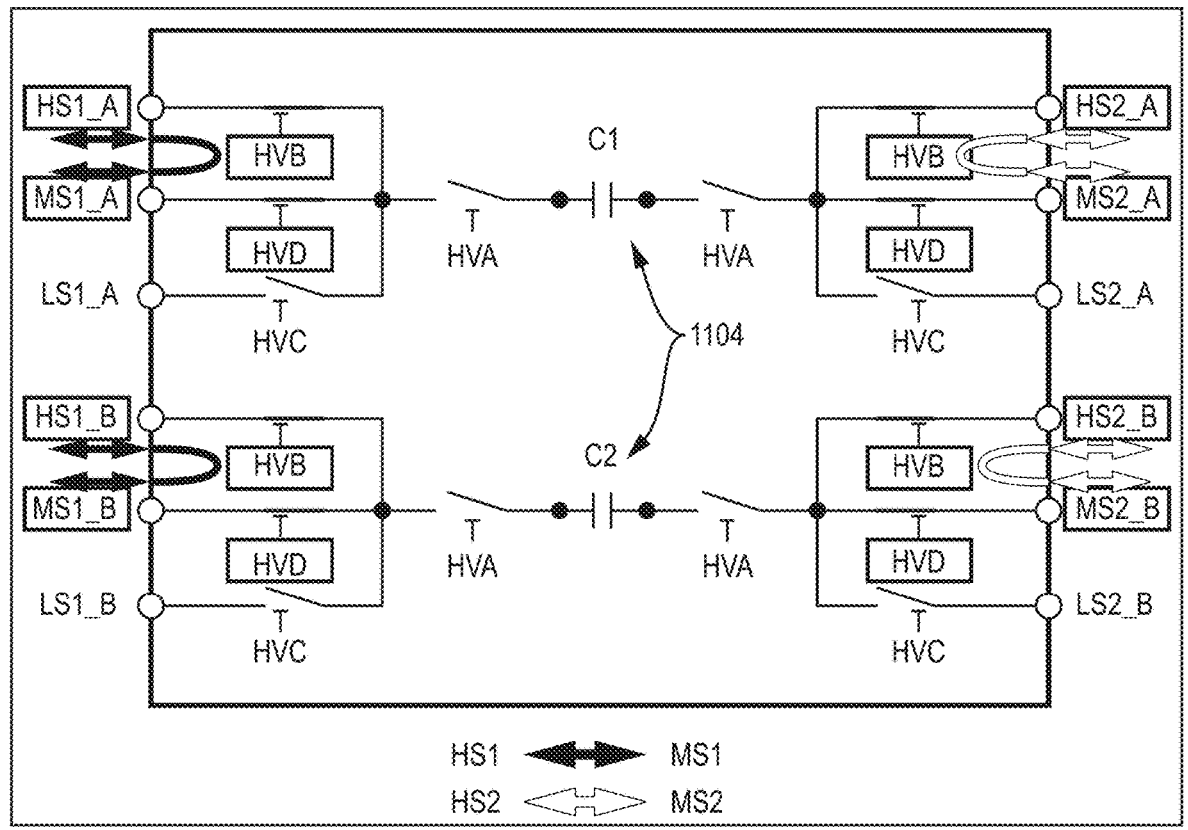
Figure 13E:
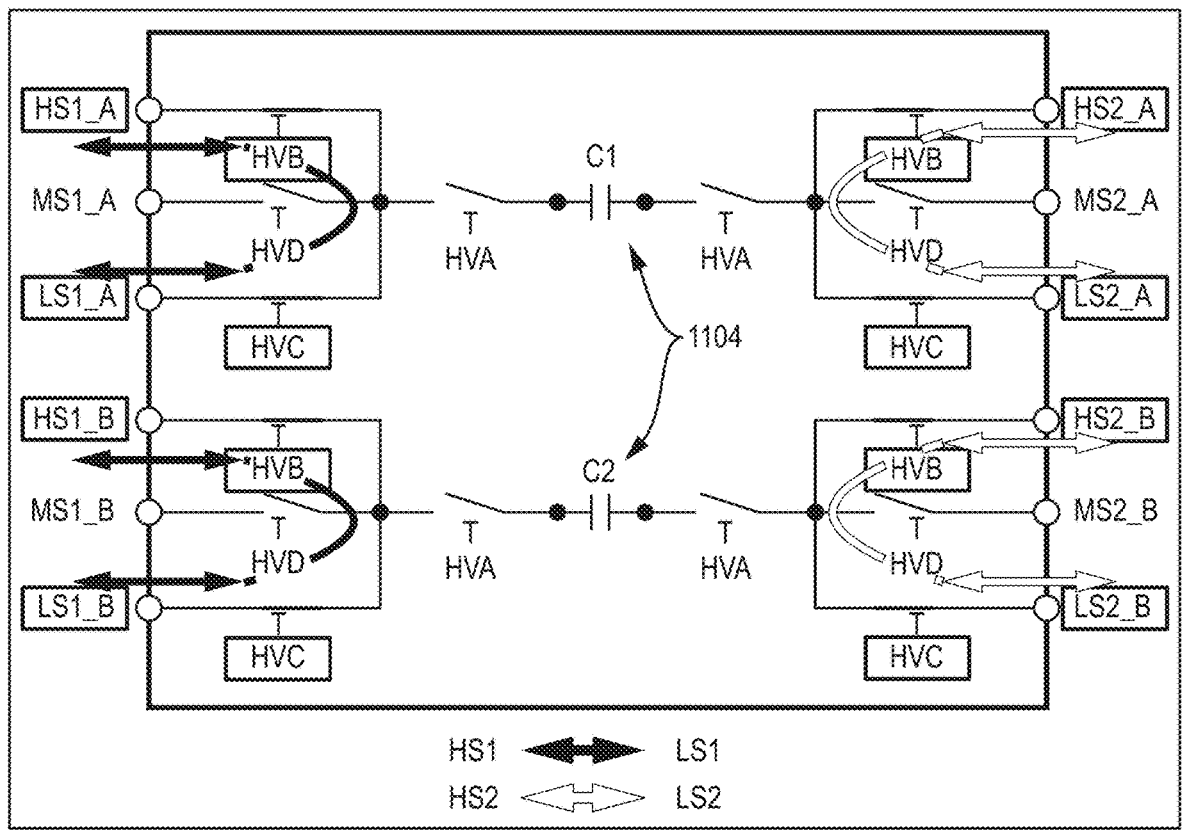
Figure 13F:
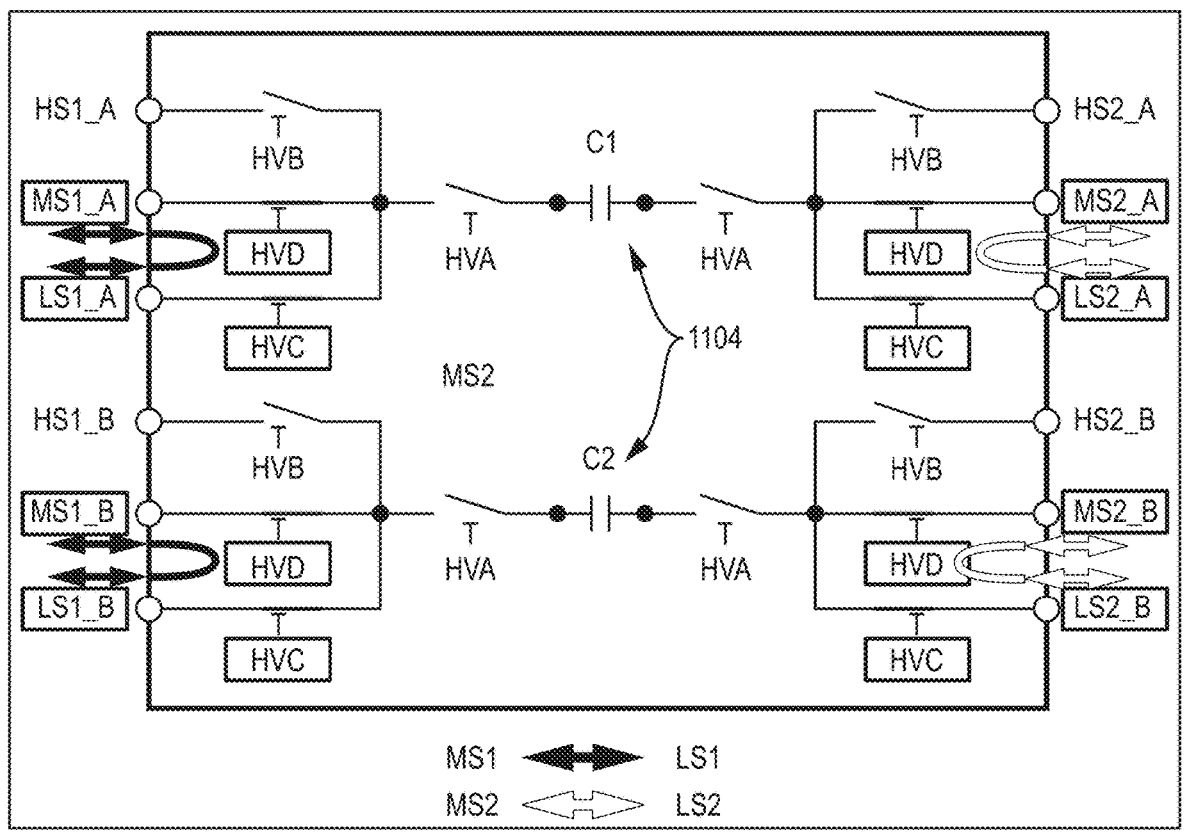

FIGS. 13A through 13F show various open/close configurations of the switches in device 1200. FIGS. 13A, 13B, and 13C depict loopback signal paths that pass through coupling capacitors 1104. FIGS. 13D, 13E, and 13F depict loopback paths that do not included coupling capacitors.

FIG. 13A shows the configuration required to loop signals HS1_A and HS1_B to signals HS2_A and HS2_B, respectively.

FIG. 13B shows the configuration required to loop signals MS1_A and MS1_B to signals MS2_A and MS2_B, respectively.

FIG. 13C shows the configuration required to loop signals LS1_A and LS1_B to signals LS2_A and LS2_B, respectively.

FIG. 13D shows the configuration required to loop signals HS1_A and HS2_A to signals MS1_A and MS2_A, respectively, and to loop signals HS1_B and HS2_B to signals MS1_B and MS2_B, respectively.

FIG. 13E shows the configuration required to loop signals HS1_A and HS2_A to signals LS1_A and LS2_A, respectively, and to loop signals HS1_B and HS2_B to signals LS1_B and LS2_B, respectively.

FIG. 13F shows the configuration required to loop signals MS1_A and MS2_A to signals LS1_A and LS2_A, respectively, and to loop signals MS1_B and MS2_B to signals LS1_B and LS2_B, respectively.

Table 1 shows specific switch control states for the example embodiment configurations described in FIGS. 13A through 13F. A switch control value of "HIGH" means that the switch is closed, while a control value of "LOW" means that the switch is open.

TABLE 1

| Input | Output | HVA | HVB | HVC | HVD | Path Name | FIG. |
|---|---|---|---|---|---|---|---|
| HS1 | HS2 | HIGH | LOW | HIGH | LOW | HS Loopback | FIG. 13A |
| HS1 | MS1 | LOW | LOW | HIGH | HIGH | DUT to ATE | FIG. 13D |
| HS1 | LS1 | LOW | HIGH | HIGH | LOW | DUT to TBD | FIG. 13E |
| MS2 | HS2 | LOW | LOW | HIGH | HIGH | ATE to DUT | FIG. 13D |
| MS2 | LS2 | LOW | HIGH | LOW | HIGH | ATE to TBD | FIG. 13F |
| MS1 | MS2 | HIGH | LOW | LOW | HIGH | MS Loopback | FIG. 13B |
| LS2 | HS2 | LOW | HIGH | HIGH | LOW | TBD to DUT | FIG. 13E |
| LS1 | MS1 | LOW | HIGH | LOW | HIGH | TBD to ATE | FIG. 13F |
| LS1 | LS2 | HIGH | HIGH | LOW | LOW | LS Loopback | FIG. 13C |

(TBD = To be determined)

While example embodiments have been particularly shown and described, it will be understood by those skilled in the art that various changes in form and details may be made therein without departing from the scope of the embodiments encompassed by the appended claims.

What is claimed is:

1. A device for switching a differential signal, comprising:
an input port comprising a first conductor and a second conductor;
a first output port comprising a third conductor and a fourth conductor;
a second output port comprising a fifth conductor and a sixth conductor;
a first micro electromechanical system (MEMS) switch having an input, a first output and a second output, the first MEMS switch input being electrically coupled to the first conductor through a first signal path, the first MEMS switch output being electrically coupled to the third conductor through a second signal path, and the second MEMS switch output being electrically coupled to the fifth conductor through a third signal path;
a second MEMS switch having an input, a first output, and a second output, the second MEMS switch input being electrically coupled to the second conductor through a fourth signal path, the second MEMS switch first output being electrically coupled to the fourth conductor through a fifth signal path, and the second MEMS switch second output being electrically coupled to the sixth conductor through a sixth signal path;
the first signal path and the second signal path being spatially matched with respect to length and orientation;
the third, fourth, fifth and sixth signal paths being spatially matched with respect to length and orientation.

2. The device of claim 1, wherein the third, fourth, fifth, and sixth signal paths are distributed through at least two layers of electrical conductors, each adjacent pair of layers of electrical conductors being separated by an electrically insulating layer.

3. The device of claim 1, wherein the first signal path and the second signal path are disposed between adjacent layers of electrically conductive material that are fixed at a common voltage potential.

4. The device of claim 3, wherein at least a portion of each of the first signal path and the second signal path is disposed as coplanar waveguides.

5. The device of claim 3, further comprising two or more conductive vias arranged on either side of each of the first signal path and the second signal path, wherein each of the two or more conductive vias is electrically coupled to the adjacent layers of electrically conductive material.

6. The device of claim 1, wherein the first MEMS switch and the second MEMS switch each has a pole corresponding to a first contact and at least two throws associated with at least a second contact and a third contact, wherein the second contact and the third contact are symmetrically distributed about the first contact.

7. A device for switching a differential signal within an operating frequency range, comprising:
a first signal path from a first signal component of a differential input port to a first micro electromechanical system (MEMS) switch input of a first MEMS switch, and from a first MEMS switch output of the first MEMS switch to a first signal component of a differential output port;
a second signal path from a second signal component of the differential input port to a second MEMS switch input of a second MEMS switch, and from a second MEMS switch output of the second MEMS switch to a second signal component of the differential output port;
each of the first signal path and the second signal path is distributed through at least two layers of electrical conductors, with adjacent layers of electrical conductors separated by electrically insulating layers;
an electrical length of the first signal path is substantially the same as an electrical length of the second signal path; and
a spatial orientation of the first signal path is matched to a spatial orientation of the second signal path such that an impedance of the first signal path at a frequency within the operating frequency range is substantially the same as an impedance of the second signal path at the frequency within the operating frequency range.

8. The device of claim 7, wherein the first signal path and the second signal path are disposed between layers of electrically conductive material that are fixed at a common voltage potential.

9. The device of claim 8, wherein at least a portion of each of the first signal path and the second signal path is disposed as a coplanar waveguide or a stripline waveguide.

10. The device of claim 8, further comprising two or more conductive vias arranged on either side of each of the first signal path and the second signal path, wherein each of the two more conductive vias are electrically coupled to the layers of electrically conductive material.

11. The device of claim 7, wherein the spatial orientation of the first signal path is symmetrical to the spatial orientation of the second signal path.

12. The device of claim 7, wherein the first MEMS switch and the second MEMS switch each has a pole corresponding to a first contact and at least two throws associated with at least a second contact and a third contact, wherein the second contact and the third contact are symmetrically distributed about the first contact.

13. A device for switching a differential signal, comprising:
a first micro electromechanical system (MEMS) switch mounted on a multi-layer assembly, the first MEMS switch having a first MEMS switch input that is selectively electrically coupled to one of a first MEMS switch first output and a first MEMS switch second output;
a second MEMS switch mounted on the multi-layer assembly, the second MEMS switch having a second MEMS switch input that is selectively electrically coupled to one of a second MEMS switch first output and a second MEMS switch second output;
the multi-layer assembly having a top surface, a bottom surface, a first edge, a second edge, a third edge, and a fourth edge, the first and second edges being opposite one another and the third and fourth edges being opposite one another, the multi-layer assembly comprising:
at least two layers of electrically conductive material, each adjacent pair of layers of electrically conductive material separated by an electrically insulating layer;
an input port disposed at the first edge, the input port comprising a first input conductor and a second input conductor;
a first output port disposed on the second edge, the first output port comprising a first output conductor and a second output conductor;
a second output port disposed on the second edge, the second output port comprising a third output conductor and a fourth output conductor;
the first input conductor is electrically coupled to the first MEMS switch input through a first input signal path on one of the at least two layers of electrically conductive material;
the first MEMS switch first output is electrically coupled to the first output conductor by a first output signal path that passes through two or more of the at least two layers of electrically conductive material;
the first MEMS switch second output is electrically coupled to the third output conductor by a second output signal path that passes through two or more of the at least two layers of electrically conductive material;
the second input conductor is electrically coupled to the second MEMS switch input through a second input signal path on the one of the at least two layers of electrically conductive material;
the second MEMS switch first output is electrically coupled to the second output conductor by a third output signal path that passes through two or more of the at least two layers of electrically conductive material; and
the second MEMS switch second output is electrically coupled to the fourth output conductor by a fourth output signal path that passes through two or more of the at least two layers of electrically conductive material;
the first input signal path and the second input signal path are configured such that impedance characteristics of the first input signal path and impedance characteristics of the second input signal path are substantially the same.

14. The device of claim 13, wherein each of the first input signal path and the second input signal path is disposed between two layers of electrically conductive material that are fixed at a common voltage potential, one of the two layers being immediately above the signal path and another of the two layers being immediately below the signal path.

15. The device of claim 14, wherein at least a portion of each of the first input signal path and the second input signal path is disposed as a coplanar waveguide or a stripline waveguide.

16. The device of claim 14, further comprising two or more conductive vias arranged on either side of each of the first input signal path and the second input signal path, wherein each of the two more conductive vias is electrically coupled to the layers of electrically conductive material.

17. The device of claim 13, wherein the spatial orientation of the first input signal path is symmetrical to the spatial orientation of the second input signal path.

18. The device of claim 13, wherein the first MEMS switch and the second MEMS switch each has a pole corresponding to a first contact and at least two throws associated with at least a second contact and a third contact, wherein the second contact and the third contact are symmetrically distributed about the first contact.

19. The device of claim 13, wherein the first output signal path and the third output signal path are configured such that impedance characteristics of the first output signal path and impedance characteristics of the third output signal path are substantially the same.

20. The device of claim 13, wherein the second output signal path and the fourth output signal path are configured such that impedance characteristics of the second output signal path and impedance characteristics of the fourth output signal path are substantially the same.

* * * * *